(12) United States Patent
Maekawa et al.

(10) Patent No.: US 7,116,171 B2
(45) Date of Patent: Oct. 3, 2006

(54) OPERATIONAL AMPLIFIER AND DRIVER CIRCUIT USING THE SAME

(75) Inventors: Kazuhiro Maekawa, Suwa (JP); Katsuhiko Maki, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 11/008,818

(22) Filed: Dec. 9, 2004

(65) Prior Publication Data

US 2005/0127998 A1   Jun. 16, 2005

(30) Foreign Application Priority Data

Dec. 10, 2003  (JP) .............................. 2003-412269

(51) Int. Cl.
*H03F 3/45*  (2006.01)

(52) U.S. Cl. ..................................... 330/253

(58) Field of Classification Search ................ 330/255, 330/260, 263, 264, 265, 253
See application file for complete search history.

(56) References Cited

U.S. PATENT DOCUMENTS

| 5,212,457 A | * | 5/1993 | Frey et al. .................. 330/263 |
| 6,268,769 B1 | * | 7/2001 | Yamauchi et al. .......... 330/255 |
| 6,424,219 B1 | * | 7/2002 | Kato .......................... 330/255 |
| 6,586,998 B1 | * | 7/2003 | Moraveji ..................... 330/267 |
| 6,605,993 B1 | * | 8/2003 | Suzuki ........................ 330/252 |
| 6,710,660 B1 | * | 3/2004 | Shacter ....................... 330/255 |
| 6,727,753 B1 | * | 4/2004 | Moon ......................... 330/253 |

FOREIGN PATENT DOCUMENTS

JP     2003-157054    5/2003

* cited by examiner

*Primary Examiner*—Robert Pascal
*Assistant Examiner*—Krista M. Flanagan
(74) *Attorney, Agent, or Firm*—Harness, Dickey & Pierce, P.L.C.

(57) ABSTRACT

An operational amplifier is provided including first and second conduction types of differential amplifier circuits, an output circuit for outputting an output signal by first and second driver transistors of the first and the second conduction types. The differential amplifier circuits of the first and the second conduction types include first and second differential pairs of transistors of the first and the second conduction types to which an input signal and the output signal are respectively input. When the transistor of a p-type is in an off-state, a first auxiliary circuit subsidiarily drives a first output node (a first inverted output node). When the transistor of an n-type is in an off-state, a second auxiliary circuit subsidiarily drives a second output node (a second inverted output node).

17 Claims, 13 Drawing Sheets

OPERATIONAL AMPLIFIER AND DRIVER CIRCUIT USING THE SAME

RELATED APPLICATIONS

This application claims priority to Japanese Patent Application No. 2003-412269 filed Dec. 10, 2003 which is hereby expressly incorporated by reference herein in its entirety.

BACKGROUND

1. Field of the Invention

The present invention relates to an operational amplifier and a driver circuit using the same.

2. Related Art

Conventionally, as liquid crystal panels (electro-optic devices) used for electronic apparatuses such a's mobile phones, simple matrix liquid crystal panels and active matrix liquid crystal panels using switching elements such as thin film transistors (hereinafter abbreviated as TFT) are known.

The simple matrix method has an advantage that low power consumption can more easily be achieved compared to the active matrix method on the one hand, but has a disadvantage that multi-colored images or movies are difficult to display on the other hand. In contrast, the active matrix method has an advantage that it is suitable for displaying multi-colored images or movies on the one hand, but has a disadvantage that low power consumption is difficult to achieve on the other hand.

Further, in recent years, for portable electronic apparatuses such as mobile phones, needs for displaying multi-colored images or movies increase in order to provide high quality images. Accordingly, the conventionally used simple matrix liquid crystal panels have gradually been replaced with active matrix liquid crystal panels.

Regarding the active matrix liquid crystal panel, it is preferable to provide an operational amplifier (Op-Amp) functioning as an output buffer in a data line driver circuit for driving a data line of the liquid crystal panel.

A structure of an operational amplifier known to the public is shown in FIG. 13.

In this operational amplifier, an n-type driver transistor M10 is controlled by a p-type differential input circuit including p-type transistors M7, M8, n-type transistors M5, M6, and a current source CSb. Further, a p-type driver transistor M9 is controlled by an n-type differential input circuit including p-type transistors M1, M2, n-type transistors M3, M4, and a current source CSa.

Focusing on the n-type differential input circuit, the case in which the voltage of an input signal Vin is higher than the voltage of the output signal Vout is considered. In this case, since the impedance of the n-type transistor M4 becomes larger than that of the n-type transistor M3, the gate voltages of the p-type transistors M2, M1 rise, and the impedance of the p-type transistor M1 increases. Accordingly, the gate voltage of the p-type driver transistor M9 drops, and the p-type driver transistor M9 proceeds to be switched-on.

Focusing on the p-type differential input circuit, when the voltage of the input signal Vin is higher than the voltage of the output signal Vout, the gate voltages of the n-type transistors M5, M6 rise and the impedance of the n-type transistor M5 decreases because the impedance of the p-type transistor M8 becomes smaller than the impedance of the p-type transistor M7. Accordingly, the gate voltage of the n-type driver transistor M10 drops, and the n-type driver transistor M10 proceeds to be switched-on.

As described above, when the voltage of the input signal Vin is higher than the voltage of the output signal Vout, the p-type driver transistor M9 and the n-type driver transistor M10 operate so as to increase the voltage of the output signal Vout. Note that when the voltage of the input signal Vin is lower than the voltage of the output signal Vout, they operate reversely to what is described above. As a result of the above operations, the operational amplifier proceeds to be in the balanced state in which the voltage of the input signal Vin and the voltage of the output signal Vout is approximately the same.

However, in the p-type differential input circuit the input signal Vin is supplied to the p-type transistor M7 as the gate voltage, and in the n-type differential circuit the input signal Vin is supplied to the transistor M3 as the gate voltage. Therefore, as shown in FIG. 14, input dead zones where the voltage of the input signal Vin and the voltage of the output signal Vout cannot be made equal appear in a range R1 of the input signal Vin between the high voltage side of the power supply voltages VDD and VDD−|Vthp| (Vthp denotes the threshold voltage of the p-type transistor M7) and a range R2 thereof between the low voltage side of the power supply voltages VSS and VSS+Vthn (Vthn denotes the threshold voltage of the n-type transistor M3). This is because the n-type differential input circuit does not operate because the n-type transistor M3 is kept in the off-state with the input signal in the range R2 between the low voltage side of the power supply voltages VSS and VSS+Vthn, and the p-type differential input circuit does not operate because the p-type transistor M7 is kept in the off-state with the input signal in the range R1 between the high voltage side of the power supply voltages VDD and VDD−|Vthp|.

For example, the case in which a liquid crystal panel is driven with a depth voltage having maximum amplitude (VinR) of 5 volts in 64 levels of depth is considered. In this case, if the amplitude of 5 volts is narrowed in order to generate the depth voltage corresponding to each of depth levels, there is caused a problem in the tone expression. Therefore, the depth voltage having the maximum amplitude (VDD$_R$) of 6.9 volts is generated with about 1.9 volts offset taking tolerances in the threshold voltage Vthp of the p-type transistor and the threshold voltage Vthn of the n-type transistor into consideration. Accordingly, if the voltage of the power supply system for the data line driver circuit is 5 volts, a step-up circuit is necessary to be provided to generate the depth voltage having amplitude of about 6.9 volts. If a charge pump circuit is adopted as the step-up circuit, a step-up transistor and a step-up capacitor are required, and further, a component layout in which the high voltage is considered is required causing an enlarged chip size, an increased mounting cost, and increased power consumption. In particular, since the manufacturing process for the 5 volt system as a logic power supply is not enough for a high withstand voltage transistor which can withstand applied voltage of 7 volts or higher and is necessary to be used, an increased cost of the manufacturing process is also caused.

Moreover, in the operational amplifier having a structure shown in FIG. 13, when the input signal Vin in the input dead zone is input, the p-type driver transistor M9 and the n-type transistor M10 become uncontrollable, and therefore, the through current cannot be controlled to be reduced. Accordingly, it is problematical that the stability of the circuit is degraded and the power consumption is increased.

The present invention addresses the above technical problem and has an advantage of providing an operational amplifier and a driver circuit using the same, the operational amplifier being low cost, of low power consumption, and having high drive capacity.

SUMMARY

In order to solve the problem, the present invention relates to an operational amplifier comprising:

a differential amplifier circuit (100) of a first conduction type including a first differential pair of transistors (PT1, PT2) of the first conduction type, the source of each of the transistors being connected to a first current source (CS1), and an input signal (Vin) and an output signal (Vout) being respectively input to the gate of each of the transistors, and a first current mirror circuit (CM1) for generating drain current for each of the first differential pair of transistors;

a differential amplifier circuit (110) of a second conduction type including a second differential pair of transistors (NT3, NT4) of the second conduction type, the source of each of the transistors being connected to a second current source (CS2), and the input signal and the output signal being respectively input to the gate of each of the transistors, and a second current mirror circuit (CM2) for generating drain current for each of the second differential pair of transistors;

a first auxiliary circuit (130) for driving at least one of a first output node (ND1) and a first inverted output node (NXD1) in accordance with the input signal (Vin) and the output signal (Vout), the first output node representing drains of the two transistors composing the first differential pair of transistors;

a second auxiliary circuit (140) for driving at least one of a second output node (ND2) and a second inverted output node (NXD2) in accordance with the input signal (Vin) and the output signal (Vout), the second output node representing drains of the two transistors composing the second differential pair of transistors; and an output circuit (120) including a first driver transistor (NT01) of the second conduction type whose gate voltage is controlled in accordance with the voltage of the first output node (ND1), and a second driver transistor (PTO1) of the first conduction type whose drain is connected to the drain of the first driver transistor, and whose gate voltage is controlled in accordance with the voltage of the second output node (ND2), and outputting the voltage of the drain of the first driver transistor (NT01) as the output signal (Vout), wherein the first auxiliary circuit (130) controls the gate voltage of the first driver transistor (NTO1) by driving at least one of the first output node (ND1) and the first inverted output node (NXD1) when an absolute value of a voltage between the gate and the source of the transistor (PT1) composing the first differential pair of transistors (PT1, PT2) and having a gate to which the input signal (Vin) is input is smaller than an absolute value of a threshold voltage of the transistor (PT1), and wherein the first auxiliary circuit (140) controls the gate voltage of the second driver transistor (PTO1) by driving at least one of the second output node (ND2) and the second inverted output node (NXD2) when an absolute value of a voltage between the gate and the source of the transistor (NT3) composing the second differential pair of transistors (NT3, NT4) and having a gate to which the input signal (Vin) is input is smaller than an absolute value of a threshold voltage of the transistor (NT3).

In the present invention, the operational amplifier includes the differential amplifier circuit of the first conduction type and the differential amplifier circuit of the second conduction type, and the input signal and the output signal are respectively input to the differential pairs of transistors of the different conduction types. The transistors composing each of the pairs of transistors are connected to the current sources, and the drain current for each of the transistors is generated by the current mirror circuit. The output circuit outputs the output signal in accordance with the voltage of the output nodes of the respective differential amplifier circuits.

When the input signal in the operating range of the first and the second differential pairs of transistors is input, each of the differential amplifier circuits of the first and the second conduction types performs the differential amplifying operation to control the gate voltages of the first and the second driver transistors composing the output circuit.

When the input signal of the voltage range in which the first differential pair of transistors can operate but the second differential pair of transistors cannot operate is input, the differential amplifier circuit of the first conduction type performs differential amplifying operation of the input signal and the output signal to control the gate voltage of the first driver transistor composing the output circuit. Incidentally, since each of the nodes of the differential amplifier circuit of the second conduction type becomes indefinite, the second auxiliary circuit controls the gate voltage of the second driver transistor by driving at least one of the second output node and the second inverted output node of the differential amplifier circuit of the second conduction type.

When the input signal of the voltage range in which the second differential pair of transistors cannot operate but the first differential pair of transistors can operate is input, the differential amplifier circuit of the second conduction type performs differential amplifying operation of the input signal and the output signal to control the gate voltage of the second driver transistor composing the output circuit. Incidentally, since each of the nodes of the differential amplifier circuit of the first conduction type becomes indefinite, the first auxiliary circuit controls the gate voltage of the first driver transistor by driving at least one of the second output node and the second inverted output node of the differential amplifier circuit of the first conduction type.

Thus, the gate voltages of the first and the second driver transistors composing the output circuit can be controlled, thus the unnecessary through current caused by the input signal in the range of the input dead zone can be prevented from occurring. Therefore, since the operational amplifier can be formed using the voltage between the higher potential side of the power supply voltages and the lower potential side of the power supply voltages as the amplitude, the range of the operating voltage can be narrowed without degrading the driving capacity, thus further reducing the power consumption. This means implementation of the step-up circuit or a lower withstand voltage of the manufacturing process, thus realizing the cost reduction.

Note that another element (e.g., a switching element or the like) can be provided between the first differential pair of transistors and the first current source, between the second differential pair of transistors and the second current source, or between the drains of the first and the second driver transistors.

Further, the present invention relates an operational amplifier comprising:

a differential amplifier circuit (100) of a first conduction type for amplifying a difference between an input signal (Vin) and an output signal (Vout);

a differential amplifier circuit (110) of a second conduction type for amplifying the difference between the input signal (Vin) and the output signal (Vout);

a first auxiliary circuit (130) for driving at least one of a first output node (ND1) and a first inverted output node (NXD1) of the differential amplifier circuit of the first conduction type in accordance with the input signal (Vin) and the output signal (Vout);

a second auxiliary circuit (140) for driving at least one of a second output node (ND2) and a second inverted output node (NXD2) of the differential amplifier circuit of the second conduction type in accordance with the input signal (Vin) and the output signal (Vout); and an output circuit (120) for generating the output signal in accordance with the voltage of the first and the second output nodes (ND1, ND2), wherein the differential amplifier circuit (100) of the first conduction type includes:

a first current source (CS1) whose one end is supplied with a first power supply voltage (VDD);

a first differential pair of transistors (PT1, PT2) of the first conduction type, the source of each of the transistors being connected to the other end of the first current source (CS1), the drain of each of the transistors being respectively connected to the first output node (ND1) and the first inverted output node (NXD1), and the input signal (Vin) and the output signal (Vout) being respectively input to the gate of each of the transistors; and a first current mirror circuit (CM1) including a first pair of transistors (NT1, NT2) of the second conduction type whose gates are connected to each other, the source of each of the transistors composing the first pair of transistors (NT1, NT2) being supplied with a second power supply voltage (VSS), the drain of each of the transistors being respectively connected to the first output node (ND1) and the first inverted output node (NXD1), and the drain and the gate of the transistor (NT2) being connected to each other, the transistor (NT2) composing the first pair of transistors (NT1, NT2) and being connected to the first inverted output node (NXD1), the differential amplifier circuit (110) of the second conduction type includes:

a second current source (CS2) whose one end is supplied with the second power supply voltage (VSS), a second differential pair of transistors (NT3, NT4) of the second conduction type, the source of each of the transistors being connected to the other end of the second current source (CS2), the drain of each of the transistors being respectively connected to the second output node (ND2) and the second inverted output node (NXD2), and the input signal (Vin) and the output signal (Vout) being respectively input to the gate of each of the transistors, and a second current mirror circuit (CM2) including a second pair of transistors (PT3, PT4) of the first conduction type whose gates are connected to each other, the source of each of the transistors composing the second pair of transistors being supplied with the first power supply voltage (VDD), the drain of each of the transistors being respectively connected to the second output node (ND2) and the second inverted output node (NXD2), and the drain and the gate of the transistor composing the first pair of transistors (PT3, PT4) and connected to the second inverted output node (NXD2) being connected to each other, the output circuit (120) includes:

a second driver transistor (PTQ1) of the first conduction type whose gate is connected to the second output node (ND2), and a first driver transistor (NTO1) of the second conduction type whose gate is connected to the first output node (ND1) and whose drain is connected to the drain of the second driver transistor (PTO1), and outputs the voltage of the drain as the output signal (Vout), wherein the first auxiliary circuit (130) controls the gate voltage of the first driver transistor (NTO1) by driving at least one of the first output node (ND1) and the first inverted output node (NXD1) when an absolute value of a voltage between the gate and the source of the transistor (PT1) composing the first differential pair of transistors (PT1, PT2) and having a gate to which the input signal (Vin) is input is smaller than an absolute value of a threshold voltage of the transistor (PT1), and wherein the first auxiliary circuit (140) controls the gate voltage of the second driver transistor (PT01) by driving at least one of the second output node (ND2) and the second inverted output node (NXD2) when an absolute value of a voltage between the gate and the source of the transistor (NT3) composing the second differential pair of transistors (NT3, NT4) and having a gate to which the input signal (Vin) is input is smaller than an absolute value of a threshold voltage of the transistor (NT3).

In the present invention, when the input signal in the operating range of the first and the second differential pairs of transistors is input, each of the differential amplifier circuits of the first and the second conduction types performs the differential amplifying operation to control the gate voltages of the first and the second driver transistors composing the output circuit.

When the input signal of the voltage range in which the first differential pair of transistors can operate but the second differential pair of transistors cannot operate is input, the differential amplifier circuit of the first conduction type performs differential amplifying operation of the input signal and the output signal to control the gate voltage of the first driver transistor composing the output circuit. Incidentally, since each of the nodes of the differential amplifier circuit of the second conduction type becomes indefinite, the second auxiliary circuit controls the gate voltage of the second driver transistor by driving at least one of the second output node and the second inverted output node of the differential amplifier circuit of the second conduction type.

When the input signal of the voltage range in which the second differential pair of transistors can operate but the first differential pair of transistors cannot operate is input, the differential amplifier circuit of the second conduction type performs differential amplifying operation of the input signal and the output signal to control the gate voltage of the second driver transistor composing the output circuit. Incidentally, since each of the nodes of the differential amplifier circuit of the first conduction type becomes indefinite, the first auxiliary circuit controls the gate voltage of the first driver transistor by driving at least one of the second output node and the second inverted output node of the differential amplifier circuit of the first conduction type.

Thus, the gate voltages of the first and the second driver transistors composing the output circuit can be controlled, thus the unnecessary through current caused by the input signal in the range of the input dead zone can be prevented from occurring. Therefore, since the operational amplifier can be formed using the voltage between the higher potential side of the power supply voltages and the lower potential side of the power supply voltages as the amplitude, the range of the operating voltage can be narrowed without degrading the driving capacity, thus further reducing the power consumption. This means implementation of the step-up circuit or a lower withstand voltage of the manufacturing process, thus realizing the cost reduction.

Note that another element (e.g., a switching element or the like) can be provided between the first differential pair of transistors and the first current source, between the drain of each of the transistors of the first differential pair of transistors and one of the first output node and the first inverted output node, between the second differential pair of transistors and the second current source, between the drain of each of the transistors of the second differential pair of transistors and one of the second output node and the second inverted output node, between the drains of the first and the second driver transistors, between the first output node and the gate of the first driver transistor, or between the second output node and the gate of the second driver transistor.

Further, in the operational amplifier according to the present invention, the first auxiliary circuit includes first and second current driver transistors (PA1, PA2) of the first conduction type, the source of each of the transistors being supplied with the first power supply voltage (VDD), the drain of each of the transistors being respectively connected to the first output node (ND1) and the first inverted output node (NXD1), a first current control circuit (132) for controlling the gate voltages of the first and the second current driver transistors (PA1, PA2) in accordance with the input signal (Vin) and the output signal (Vout), wherein the first current control circuit (132) can control the gate voltages of the first and the second current driver transistor (PA1, PA2) so as to drive at least one of the first output node (ND1) and the first inverted output node (NXD1) when an absolute value of a voltage between the gate and the source of the transistor (PT1) composing the first differential pair of transistors (PT1, PT2) and having a gate to which the input signal (Vin) is input is smaller than an absolute value of a threshold voltage of the transistor (PT1).

According to the present invention, the first output node or the first inverted output node can be driven with a simple configuration by controlling the gate voltages of the first and the second current driver transistors. As a result, the gate voltage of the first driver transistor can be controlled with a simple configuration.

Note that another element (e.g., a switching element or the like) can be provided between the drain of the first or the second current driver transistor and the first output node or the first inverted output node.

Further, in the operational amplifier according to the present invention, the second auxiliary circuit (140) includes:

third and fourth current driver transistors (NA3, NA4) of the second conduction type, the source of each of the transistors being supplied with the second power supply voltage (VSS), the drain of each of the transistors being respectively connected to the second output node (ND2) and the second inverted output node (NXD2), a second current control circuit (142) for controlling the gate voltages of the third and the fourth current driver transistors (NA3, NA4) in accordance with the input signal (Vin) and the output signal (Vout), and wherein the second current control circuit (142) can control the gate voltages of the third and the fourth current driver transistors (NA3, NA4) so as to drive at least one of the second output node (ND2) and the second inverted output node (NXD2) when an absolute value of a voltage between the gate and the source of the transistor (NT3) composing the second differential pair of transistors (NT3, NT4) and having a gate to which the input signal (Vin) is input is smaller than an absolute value of a threshold voltage of the transistor (NT3).

According to the present invention, the second output node or the second inverted output node can be driven with a simple configuration by controlling the gate voltages of the third and the fourth current driver transistors. As a result, the gate voltage of the second driver transistor can be controlled with a simple configuration.

Note that another element (e.g., a switching element or the like) can be provided between the drain of the third or the fourth current driver transistor and the second output node or the second inverted output node.

Further, in the operational amplifier according to the present invention, the first current control circuit (132) can include a third current source (CS3) whose one end is supplied with the second power supply voltage (VSS), a third differential pair of transistors (NS5, NS6) of the second conduction type, the source of each of the transistors being connected to the other end of the third current source (CS3), the input signal (Vin) and the output signal (Vout) being respectively input to the gate of each of the transistors, and fifth and sixth current driver transistors (PS5, PS6) of the first conduction type, the source of each of the transistors being supplied with the first power supply voltage (VDD), the drain of each of the transistors being respectively connected to the drain of each of the transistors of the third differential pair of transistors (NS5, NS6), the gate and the drain of each of the transistors being connected to each other, the drain of the transistor (NS5) composing the third differential pair of transistors and having a gate to which the input signal (Vin) is input being connected to the gate of the second current driver transistor (PA2), the drain of the transistor (NS6) composing the third differential pair of transistors and having a gate to which the output signal (Vout) is input being connected to the gate of the first current driver transistor (PA1).

According to the present invention, even when the input signal in a voltage range in which the first differential pair of transistors cannot operate is input, the first output node and the first inverted output node can subsidiarily be driven with a simple configuration by the first and the second current driver transistors controlled by the first current control circuit.

Note that another element (e.g., a switching element or the like) can be provided between the source of each of the transistors composing the third differential pair of transistors and the third current source, between the drain of each of the transistors of the third differential pair of transistors and the drains of the fifth or sixth current driver transistors, between the drain of the transistor composing the third differential pair of transistors and having a gate to which the input signal is input and the gate of the second current driver transistor, or between the drain of the transistor composing the third differential pair of transistors and having a gate to which the output signal is input and the gate of the first current driver transistor.

Further, in the operational amplifier according to the present invention, the second current control circuit (142) can include a fourth current source (CS4) whose one end is supplied with the first power supply voltage (VDD), a fourth differential pair of transistors (PS7, PS8) of the first conduction type, the source of each of the transistors being connected to the other end of the fourth current source (CS4), the input signal (Vin) and the output signal (Vout) being respectively input to the gate of each of the transistors, and seventh and eighth current driver transistors (NS7, NS8) of the second conduction type, the source of each of the transistors being supplied with the second power supply voltage (VSS), the drain of each of the transistors being respectively connected to the drain of each of the transistors of the fourth differential pair of transistors (PS7, PS8), the gate and the drain of each of the transistors being connected to each other, the drain of the transistor (PS7) composing the fourth differential pair of transistors and having a gate to which the input signal (Vin) is input being connected to the gate of the fourth current driver transistor (NA4), the drain of the transistor (PS8) composing the fourth differential pair of transistors and having a gate to which the output signal (Vout) is input being connected to the gate of the third current driver transistor (NA3).

According to the present invention, even when the input signal in a voltage range in which the second differential pair of transistors cannot operate is input, the second output node and the second inverted output node can subsidiarily be driven with a simple configuration by the third and the fourth current driver transistors controlled by the second current control circuit.

Note that another element (e.g., a switching element or the like) can be provided between the source of each of the transistors composing the fourth differential pair of transistors and the fourth current source, between the drain of each of the transistors composing the fourth differential pair of transistors and the drains of the seventh or eighth current driver transistors, between the drain of the transistor composing the fourth differential pair of transistors and having a gate to which the input signal is input and the gate of the seventh current driver transistor, or between the drain of the transistor composing the fourth differential pair of transistors and having a gate to which the output signal is input and the gate of the eighth current driver transistor.

Further, in the operational amplifier according to the present invention, the operating current values of the first and the third current sources (CS1, CS3) can be the same, and the operating current values of the second and the fourth current sources (CS2, CS4) can also be the same.

According to the present invention, since the balance of the drain currents of the first and the second driver transistors can be maintained, the rising edges or the falling edges of the output signal can be aligned, thus stabilizing the output to be prevented from oscillating.

Further, in the operational amplifier according to the present invention, the operating current values of the first through the fourth current sources (CS1 through CS4) can be the same.

Further, in the operational amplifier according to the present invention, at least one of the ratio of a current drive capacity of the first current driver transistor (PA1) to the current drive capacity of the sixth current driver transistor (PS6), the ratio of the current drive capacity of the second current driver transistor (PA2) to the current drive capacity of the fifth current driver transistor (PS5), the ratio of the current drive capacity of the third current driver transistor (NA3) to the current drive capacity of the eighth current driver transistor (NS8), and the ratio of the current drive capacity of the fourth current driver transistor (NA4) to the current drive capacity of the seventh current driver transistor (NS7) can be greater than 1.

According to the present invention, the current values of the current sources of the first and the second auxiliary circuits can be reduced, thus further reducing power consumption.

Further, the present invention relates to a driver circuit for driving an electro-optic device having a plurality of scanning lines, a plurality of data lines, a pixel electrode specified by the scanning line and the data line, comprising:

the operational amplifier described above provided for the data line;

a data voltage generation circuit provided for the data line for generating a data voltage as an input signal to the operational amplifier.

According to the present invention, the driver circuit capable of realizing low cost and low power consumption without degrading the drive capacity can be provided.

DETAILED DESCRIPTION

Hereinafter, an embodiment of the present invention is described in detail with reference to the accompanying drawings. Note that the embodiment described below does not limit the scope of the present invention as claimed. Further, it is not necessary that all components of the configuration described below are essential elements of the present invention.

1. Liquid Crystal Device

Figure 1:
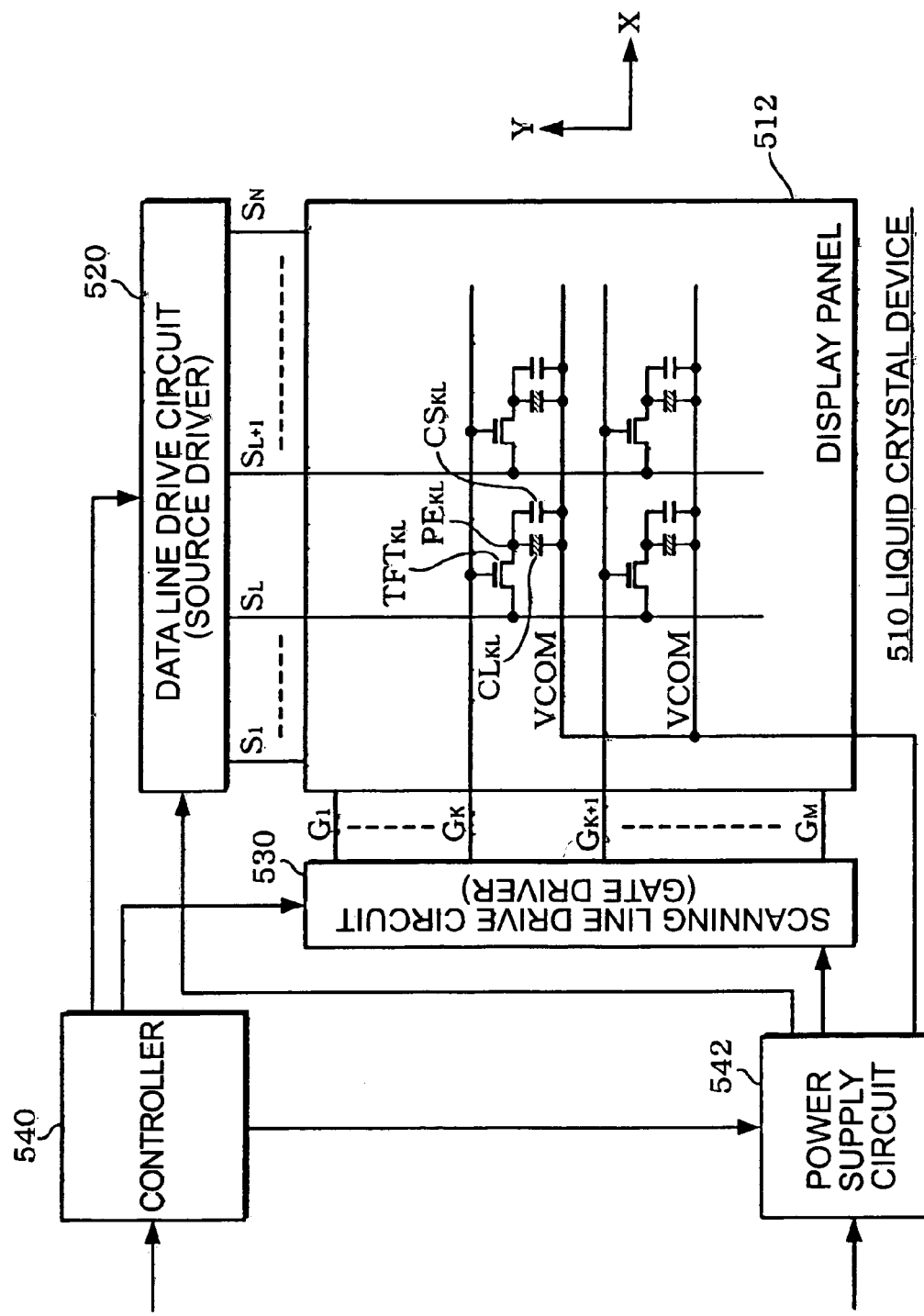
FIG. 1 is a block diagram of a liquid crystal device applying an operational amplifier according to the present embodiment.

FIG. 1 shows an example of a block diagram of a liquid crystal device equipped with an operational amplifier according to the present embodiment.

The liquid crystal device 510 (in the broad sense, a display device) includes a display panel 512 (in the narrow sense, a LCD (liquid crystal display) panel), a data line driver circuit 520 (in the narrow sense, a source driver), a scanning line driver circuit 530 (in the narrow sense, a gate driver), a controller 540, and a power supply circuit 542. Note that the liquid crystal device does not necessarily include all of these circuit blocks, and a configuration without a part of theses circuit blocks can also be adopted.

In this case, the display panel 512 (in the broad sense, an electro-optic device) includes a plurality of scanning lines (in the narrow sense, the gate lines), a plurality of data lines (in the narrow sense, the source lines), and pixel electrodes specified by the scanning lines and the data lines. In this case, an active matrix type of liquid crystal display device can be composed by connecting to the data line a thin film transistor TFT (in the broad sense, a switching element) connected to the pixel electrode.

More specifically, the display panel 512 is formed on an active matrix substrate (e.g., a glass substrate). On the active matrix substrate, there are disposed scanning lines $G_1$ through $G_M$ (M denotes a natural number equal to or greater than two) arranged in the Y direction in FIG. 1 and each extending in the X direction and data lines $S_1$ through $S_N$ (N denotes a natural number equal to or greater than two) arranged in the X direction and each extending in the Y direction. Further, a thin film transistor $TFT_{KL}$ (in the broad sense, a switching element) is provided at a position corresponding to the intersection of the scanning line $G_K$ ($1 \leq K \leq M$, K denotes a natural number) and the data line $S_L$ ($1 \leq L \leq N$, L denotes a natural number).

The gate electrode of the $TFT_{KL}$ is connected to the scanning line $G_K$, the source electrode of the $TFT_{KL}$ is connected to the data line $S_L$, and the drain electrode of the $TFT_{KL}$ is connected to the pixel electrode $PE_{KL}$. A liquid crystal capacitance $CL_{KL}$ (a liquid crystal element) and an auxiliary capacitance $CS_{KL}$ are formed between the pixel electrode $PE_{KL}$ and an opposing electrode VCOM (a common electrode) facing the pixel electrode PEKL across a liquid crystal element (in the broad sense, an electro-optic material). The liquid crystal material is enclosed between the active matrix substrate, on which the $TFT_{KL}$, the pixel electrode $PE_{KL}$, and so on are formed, and the opposing substrate with the opposing electrode VCOM formed thereon so that the transmittance of the pixel changes in accordance with the voltage applied between the pixel electrode $PE_{KL}$ and the opposing electrode VCOM.

Note that the electric potential applied to the opposing electrode VCOM is generated by the power supply circuit 542. Further, the opposing electrode VCOM is not necessarily formed over the surface of the opposing substrate, and can be formed like strips respectively corresponding to each of the scanning lines.

The data line driver circuit 520 drives the data lines $S_1$ through $S_N$ of the display panel 512 based on image data. Meanwhile, the scanning line driver circuit 530 sequentially drives the scanning lines $G_1$ through $G_M$ of the display panel 512 for scanning.

The controller 540 controls the data line driver circuit 520, the scanning line driver circuit 530, and the power supply circuit 542 based on the contents set by a host such as a central processing unit (CPU) not shown in the drawings.

More specifically, the controller 540 supplies the data line driver circuit 520 and the scanning line driver circuit 530 with, for example, a configuration of an operational mode or a vertical sync signal and a horizontal sync signal generated inside thereof, and controls the power supply circuit 542 in a polarization reversing timing of the potential of the opposing electrode VCOM.

The power supply circuit 542 generates various voltages (depth voltages) necessary for driving the display panel 512 and the potential of the opposing electrode VCOM based on a reference voltage supplied externally.

Note that, although the liquid crystal device 510 has a configuration including the controller 540 in FIG. 1, the controller 540 can also be provided outside the liquid crystal device 510. Alternatively, the liquid crystal device can include the host in combination with the controller 540. Further, a part or the whole of the data line driver circuit 520, the scanning line driver circuit 530, the controller 540, and the power supply 542 can be formed on the display panel 512.

1.1 Data Line Driver Circuit

Figure 2:
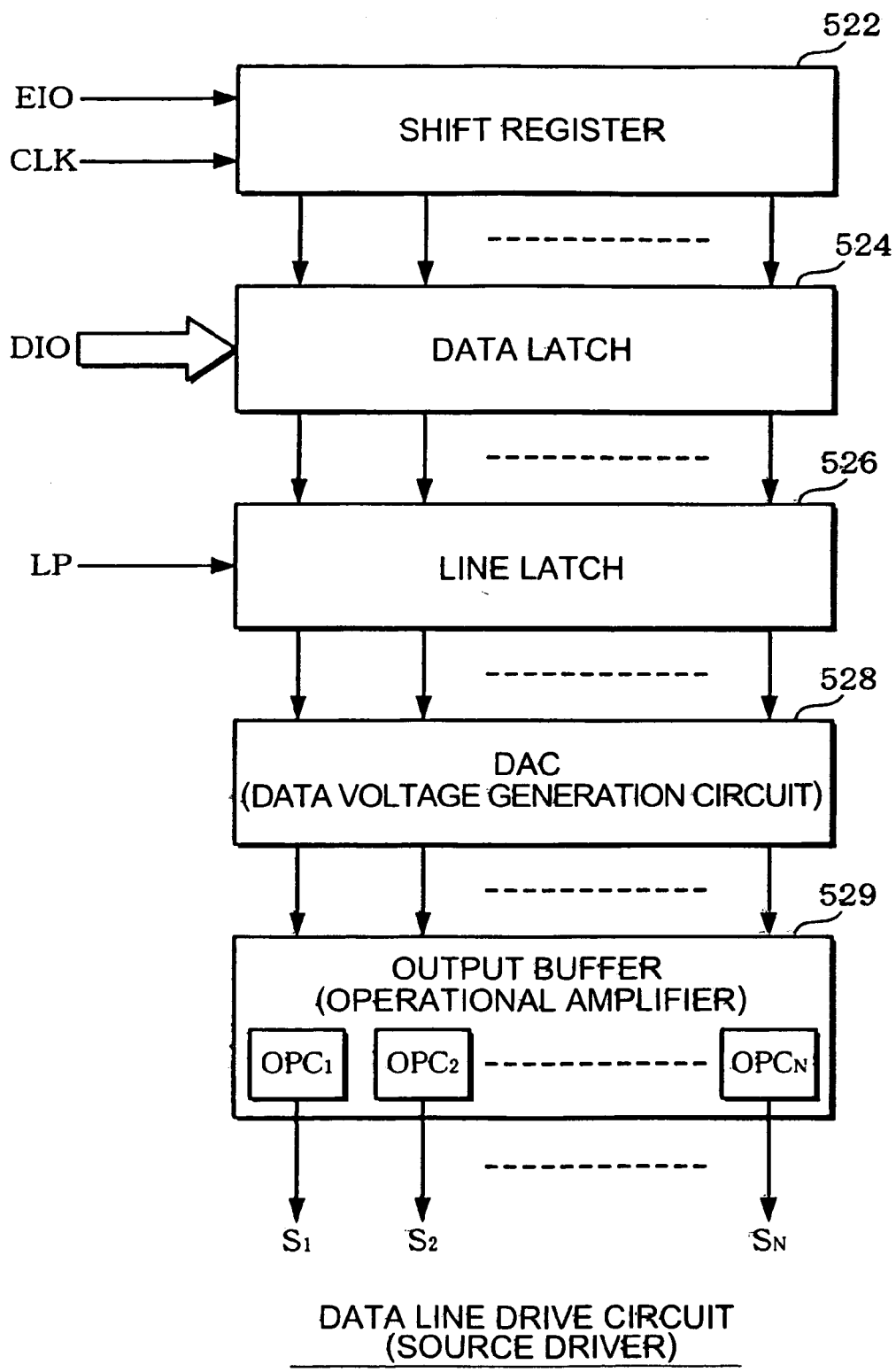
FIG. 2 is a circuit diagram showing a configuration example of the data line driver circuit shown in FIG. 1.

FIG. 2 shows a configuration example of the data line driver circuit 520 shown in FIG. 1.

The data line driver circuit 520 (in the broad sense, a driver circuit) includes a shift register 522, a data latch 524, a line latch 526, a DAC (digital to analog converter; in the broad sense, a data voltage generation circuit) 528, and an output buffer (an operational amplifier) 529.

The shift register 522 is provided corresponding to each of the data lines and includes a plurality of flip-flops connected in series. The shift register 522 acquires an input/output enable signal EIO in sync with a clock signal CLK and then sequentially shifts the input/output enable signal EIO to the adjacent flip-flop in sync with the clock signal CLK.

The image data (DIO) is input to the data latch 524 in the unit of, for example, 18 bits (6 bits (depth data) multiplied by 3 (RGB colors)) from the controller 540. The data latch 524 latches the image data (DIO) in sync with the input/output enable signal EIO sequentially shifted by each of the flip-flops of the shift register 522.

The line latch 526 latches, in sync with the horizontal sync signal LP supplied from the controller 540, one horizontal scanning unit of the image data latched by the data latch 524.

The DAC 528 generates analogous data voltages to be supplied to the respective data lines. Specifically, the DAC 528 selects, based on the digital image data supplied from the line latch 526, either one of the depth voltages supplied from the power supply circuit 542 shown in FIG. 1, and outputs the analogous data voltages in accordance with the digital image data.

The output buffer 529 buffers the data voltages from the DAC 528 to output to the data lines whereby driving the data lines. Specifically, the output buffer 529 includes operational amplifiers OPCI through OPCN each having a structure of the voltage follower connection and provided for the respective data lines, and each of the operational amplifiers OPCi through OPCN outputs the data voltage from the DAC 528 to the respective data lines after the impedance conversion.

Note that, although the configuration is shown in FIG. 2, in which the digital image data is output to the data lines via the output buffer 529 after digital-analog converted, an alternative configuration, in which the analogous video signal is sampled and held to output to the data lines via the output buffer 529, can be adopted.

1.2 Scanning Line Driver Circuit

Figure 3:
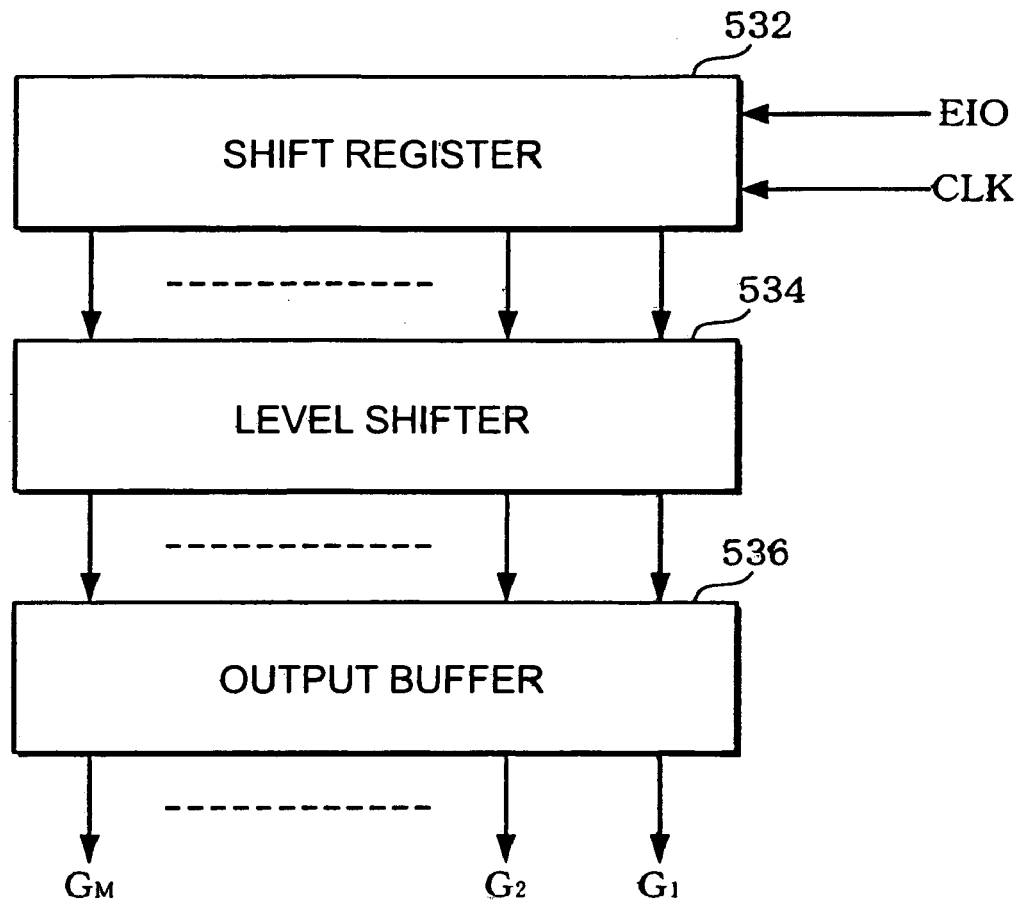
FIG. 3 is a circuit diagram showing a configuration example of the scanning line driver circuit shown in FIG. 1.

FIG. 3 shows a configuration example of the scanning line driver circuit 530 shown in FIG. 1.

The scanning line driver circuit 530 includes a shift register 532, a level shifter 534, and an output buffer 536.

The shift register 532 is provided corresponding to each of the scanning lines and includes a plurality of flip-flops connected in series. The shift register 532 acquires an input/output enable signal EIO in sync with a clock signal CLK and then sequentially shifts the input/output enable signal EIO to the adjacent flip-flop in sync with the clock signal CLK. Note that the input/output enable signal EIO input thereto is a vertical sync signal supplied from the controller 540.

The level shifter 534 shifts the voltage level of the shift register 532 to a voltage level suitable for the liquid crystal element of the display panel 512 and the capacity of the TFT as a transistor. As the voltage level, for example, a rather high voltage level of 20 through 50 volts is required.

The output buffer 536 buffers the scanning voltages shifted by the level shifter 534 to output to the scanning lines whereby driving the scanning lines.

2. Operational Amplifier

In recent years, the number of the data lines tends to be increased because of increased definition of display images and enlarged display panel sizes. As the number of the data lines in the display panel increases, the distance between the data lines adjacent to each other is shortened to increase the wiring capacitance therebetween. Accordingly, an operational amplifier with high drive capacity is required in order to drive the data line in a predetermined period of time.

However, the power consumption of the operational amplifiers is large, and, as described above, the operational amplifier is provided for each of the data lines as the output buffer therefore. Therefore, an operational amplifier capable of realizing low power consumption without degrading the drive capacity is required.

Figure 13:
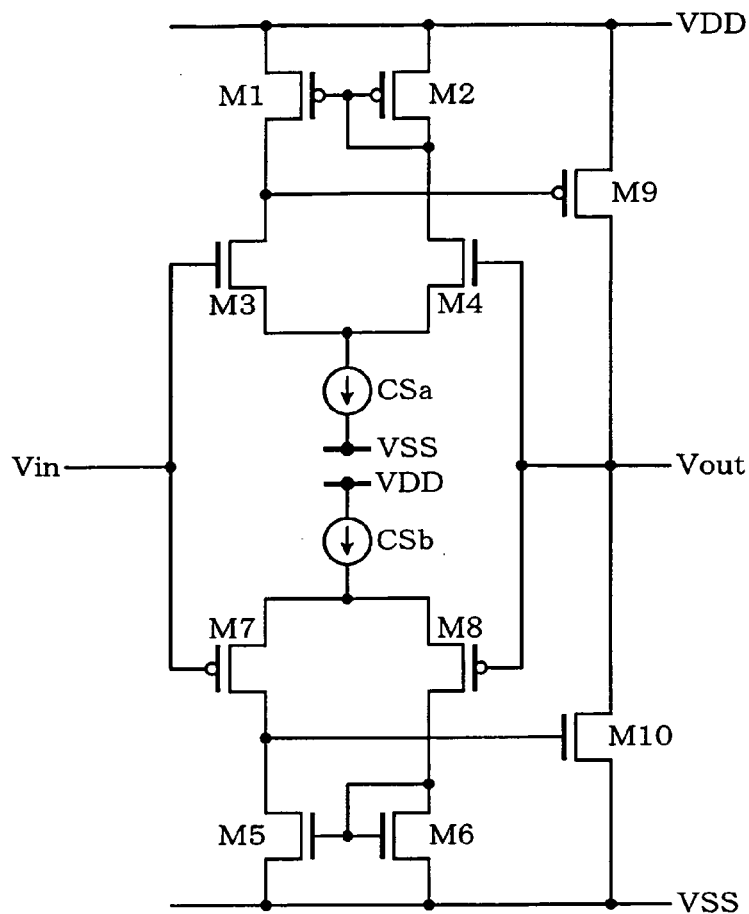
FIG. 13 is a circuit diagram showing a configuration of a conventional operational amplifier.
Figure 14:
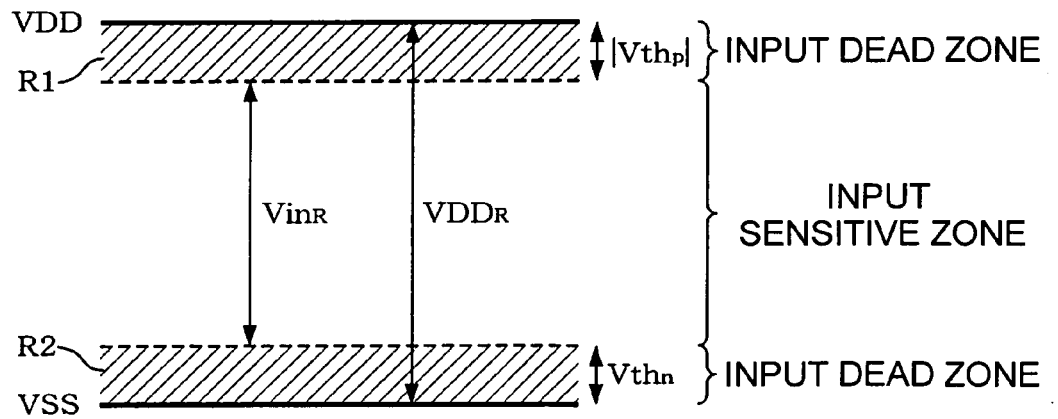
FIG. 14 is a chart for explaining input dead zones.

Since the operational amplifier shown in FIG. 13 has the input dead zone, it needs to be operated with the amplitude of about 7 volts, and moreover, the through current cannot be controlled if the input voltage is in the dead zone, accordingly, the power consumption cannot be reduced. In contrast, with the operational amplifier according to the present embodiment which adopts a configuration described below to eliminate any input dead zones and to surely suppress the through current, the power consumption can significantly be reduced.

Figure 4:
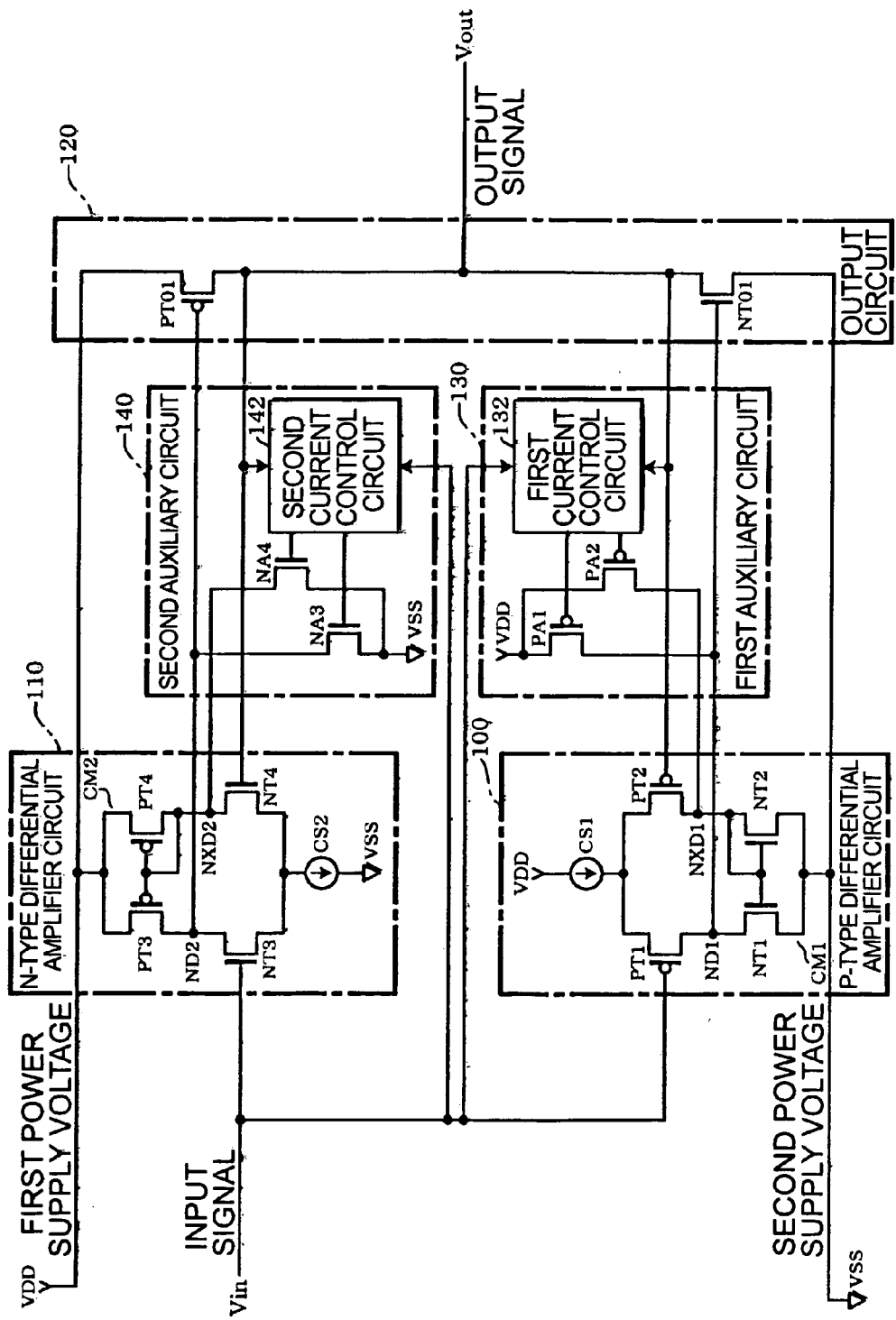
FIG. 4 is a circuit diagram showing a configuration example of an operational amplifier according to the present embodiment.

A configuration example of an operational amplifier according to the present embodiment is shown in FIG. 4.

The operational amplifier includes a p-type (e.g., a first conduction type) differential amplifier circuit 100, an n-type (e.g., a second conduction type) differential amplifier circuit 110, and a output circuit 120. The p-type differential amplifier circuit 100, the n-type differential amplifier circuit 110, and the output circuit 120 have the operational voltages between a higher potential side VDD (in the broad sense, a first power supply voltage) of the power supply voltages and a lower potential side VSS (in the broad sense, a second power supply voltage) of the power supply voltages.

The p-type differential amplifier circuit 100 amplifies the difference between the input signal Vin and the output signal Vout. The p-type differential amplifier circuit 100 has an output node ND1 (a first output node) and an inverted output node NXD1 (a first inverted output node), and outputs, between the output node ND1 and the inverted output node NXD1, a voltage corresponding to the difference between the input signal Vin and the output signal Vout.

The p-type differential amplifier circuit 100 has a first current mirror circuit CM1 and a first differential pair of p-type (a first conduction type) transistors. The first differential pair of transistors includes p-type metal oxide semiconductor (hereinafter abbreviated as MOS) transistors (Hereinafter, a MOS transistor is simply abbreviated as a transistor) PT1, PT2. The source of each of the p-type transistors PT1, PT2 is connected to a first current source CS1 while the input signal Vin and the output signal Vout are respectively connected to the gates of the transistors. The drain currents of the p-type transistors PT1, PT2 are generated by the first current mirror circuit CM1. The input signal Vin is input to the gate of the p-type transistor PT1. The output signal Vout is input to the gate of the p-type transistor PT2. The drain of the p-type transistor PT1 becomes the output node ND1 (the first output node). The drain of the p-type transistor PT2 becomes the inverted output node NXD1 (the first inverted output node).

The n-type differential amplifier circuit 110 amplifies the difference between the input signal Vin and the output signal Vout. The n-type differential amplifier circuit 110 has an output node ND2 (a second output node) and an inverted output node NXD2 (a second inverted output node), and outputs, between the output node ND2 and the inverted output node NXD2, a voltage corresponding to the difference between the input signal Vin and the output signal Vout.

The n-type differential amplifier circuit 110 has a second current mirror circuit CM2 and a second differential pair of n-type (a second conduction type) transistors. The second differential pair of transistors includes n-type transistors NT3, NT4. The source of each of the n-type transistors NT1, NT2 is connected to a second current source CS2 while the input signal Vin and the output signal Vout are respectively connected to the gates of the transistors. The drain currents of the n-type transistors NT3, NT4 are generated by the second current mirror circuit CM2. The input signal Vin is input to the gate of the n-type transistor NT3. The output signal Vout is input to the gate of the n-type transistor NT4. The drain of the n-type transistor NT3 becomes the output node ND2 (the second output node). The drain of the n-type transistor NT4 becomes the inverted output node NXD2 (the second inverted output node).

The output circuit 120 generates the output signal Vout based on the voltage of the output node ND1 (the first output node) of the p-type differential amplifier circuit 100 and the voltage of the output node ND2 (the second output node) of the n-type differential circuit 110.

The output circuit 120 includes an n-type (the second conduction type) first driver transistor NTO1 and a p-type (the first conduction type) second driver transistor PTO1. The gate (voltage) of the first driver transistor NTO1 is controlled based on the voltage of the output node ND1 (the first output node) of the p-type differential amplifier circuit 100. The gate (voltage) of the second driver transistor PTO1 is controlled based on the voltage of the output node (ND2) (the first output node) of the n-type differential amplifier circuit 110. The drain of the second driver transistor PTO1 is connected to the drain of the first driver transistor NTO1. The output circuit 120 outputs the voltage of the drain of the first driver transistor NTO1 (the voltage of the drain of the second driver transistor PTO1) as the output signal Vout.

Further, the operational amplifier according to the present embodiment includes first and second auxiliary circuits 130, 140 to eliminate the input dead zone and to suppress the through current as well. As a result, the low power consumption can be realized by suppressing the through current without unnecessarily expanding the range of the operational voltage.

Note that the first auxiliary circuit 130 drives at least one of the output node ND1 (the first output node) and the inverted output node NXD1 (the first inverted output node) of the p-type differential amplifier circuit 100 in accordance with the input signal Vin and the output signal Vout. Further, the second auxiliary circuit 130 drives at least one of the output node ND2 (the second output node) and the second inverted output node (NXD2) of the n-type differential amplifier circuit 110 in accordance with the input signal Vin and the output signal Vout.

When the absolute value of the voltage between the gate and the source of the p-type transistor PT1 (the transistor composing the first differential pair of transistors and having the gate to which the input signal Vin is input) is smaller than the absolute value of the threshold voltage of the p-type transistor PT1, the first auxiliary circuit 130 controls the gate voltage of the first driver transistor NT01 by driving at least one of the output node ND1 (the first output node) and the inverted output node NXD1 (the first inverted output node).

Further, when the absolute value of the voltage between the gate and the source of the n-type transistor NT3 (the transistor composing the second differential pair of transistors and having the gate to which the input signal Vin is input) is smaller than the absolute value of the threshold voltage of the n-type transistor NT3, the second auxiliary circuit 140 controls the gate voltage of the second driver transistor PT01 by driving at least one of the output node ND2 (the second output node) and the inverted output node NXD2 (the second inverted output node).

Figure 5:
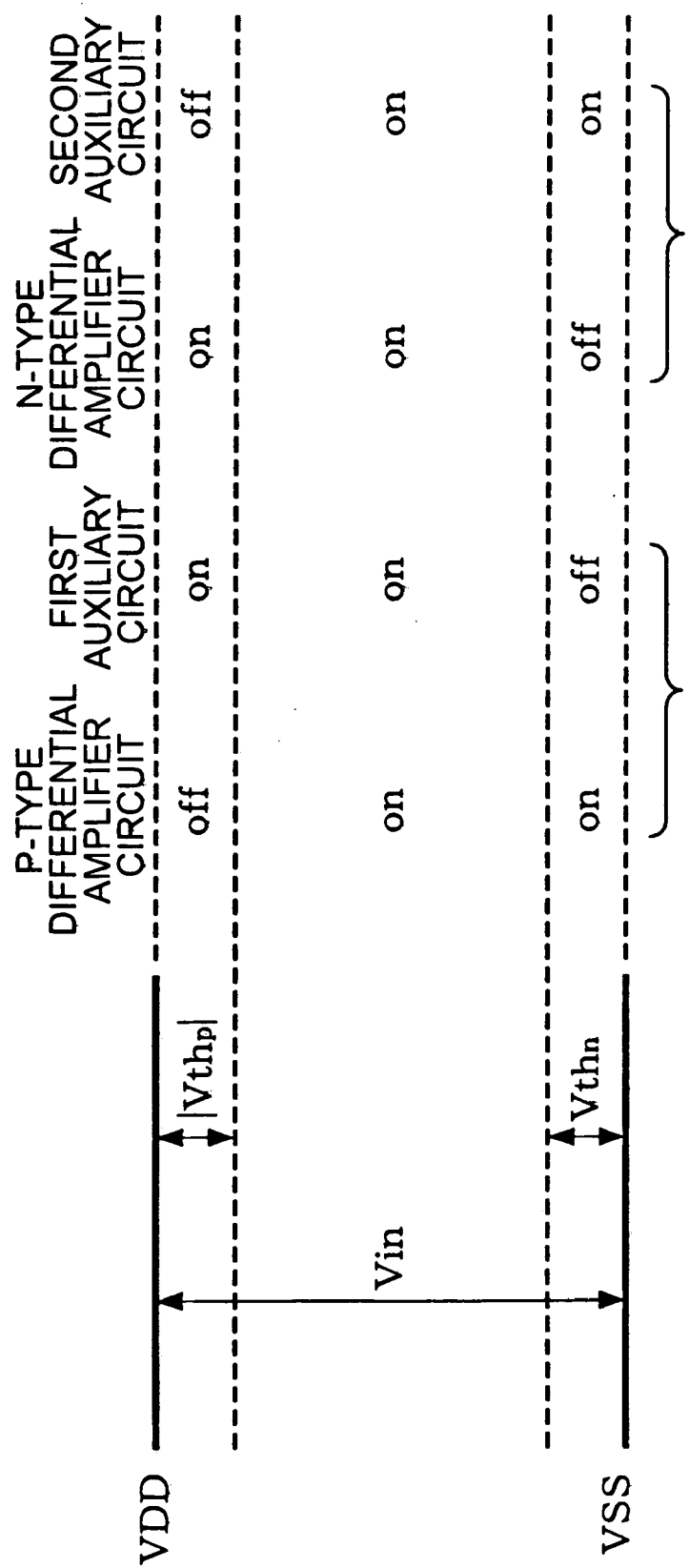
FIG. 5 is a chart for explaining an operation of the operational amplifier shown in FIG. 4.

FIG. 5 shows an operation explanatory chart for the operational amplifier circuit shown in FIG. 4.

Note that the higher potential side of the power supply voltages is denoted with VDD, the lower potential side of the power supply voltages is denoted with VSS, the input signal voltage is denoted with Vin, the threshold voltage of the p-type transistor PT1 is denoted with Vthp, and the threshold voltage of the n-type transistor NT3 is denoted with Vthn.

If the following inequality is true, the p-type transistor is in the off-state while the n-type transistor is in the on-state.

$$VDD \geq Vin > VDD - |Vthp|$$

Note that, when the p-type transistor operates in the cut-off region, the linear region, or the saturation region in accordance with the gate voltage, the off-state of the p-type transistor means that the p-type transistor is in the cut-off region. Likewise, when the n-type transistor operates in the cut-off region, the linear region, or the saturation region in accordance with the gate voltage, the on-state of the n-type transistor means that the n-type transistor is in the linear region or the saturation region. Accordingly, if the following inequality is true, the p-type differential amplifier circuit 100 does not operate (off-state) while the n-type differential amplifier circuit 110 operates (on-state).

$$VDD \geq Vin > VDD - |Vthp|$$

Then, the first auxiliary circuit 130 is switched on to start its operation (to drive at least one of the output node ND1 (the first output node) and the inverted output node NXD1 (the first inverted output node)), the second auxiliary circuit 140 is switched off to stop its operation (to stop driving both of the output node ND2 (the second output node) and the inverted output node NXD1 (the second inverted output node)). As described above, the voltage of the output node ND1 can be prevented from becoming indefinite even when the input signal Vin is in the input dead zone of the first differential pair of transistors of the p-type differential amplifier circuit 100 by driving the output node ND1 of the p-type differential amplifier circuit 100 by the first auxiliary circuit 130 within a range in which the p-type differential amplifier circuit 100 does not operate.

If the following inequality is true, the p-type transistor is in the on-state while the n-type transistor is in the off-state.

$$VDD - |Vthp| \geq Vin \geq Vthn + VSS$$

Note that, when the p-type transistor operates in the cut-off region, the linear region, or the saturation region in accordance with the gate voltage, the on-state of the p-type transistor means that it is in the linear region or the saturation region. Therefore, the p-type differential amplifier circuit 100 operates (on-state) while the n-type differential amplifier circuit 110 also operates (on-state). In this case, the operation of the first auxiliary circuit 130 is switched on or off while the operation of the second auxiliary circuit 140 is switched on or off. Namely, since the p-type differential amplifier circuit 100 and the n-type differential circuit 110 operate, the output nodes ND1, ND2 do not reach an indefinite state, and the output signal Vout is output by the output circuit 120 similarly to the differential amplifier having a configuration shown in FIG. 13. Therefore, the first and the second auxiliary circuits 130, 140 can be operated or stopped. In FIG. 5, the operations are switched on.

If the following inequality is true, the p-type transistor is in the on-state while the n-type transistor is in the off-state.

$$Vthn + VSS \geq Vin \geq VSS$$

Note that, when the n-type transistor operates in the cut-off region, the linear region, or the saturation region in accordance with the gate voltage, the off-state of the n-type transistor means that it is in the cut-off region. Therefore, the n-type differential amplifier circuit 110 does not operate (off-state) while the p-type differential amplifier circuit 100 operates (on-state). Then, the second auxiliary circuit 140 is switched on to start its operation (to drive at least one of the output node ND2 (the second output node) and the inverted output node NXD2 (the second inverted output node)), the first auxiliary circuit 130 is switched off to stop its operation. As described above, the voltage of the output node ND2 can be prevented from becoming indefinite even when the input signal Vin is in the input dead zone of the second differential pair of transistors of the n-type differential amplifier circuit 110 by driving the output node ND2 (the inverted output node NXD2) of the n-type differential amplifier circuit 110 by the second auxiliary circuit 140 within a range in which the n-type differential amplifier circuit 110 does not operate.

As described above, according to the first and the second auxiliary circuits 130, 140, the gate voltages of the first and the second driver transistors NTO1, PTO1 forming the output circuit 120 become controllable, thus eliminating unnecessary through current caused by the input signal whose voltage is in the range of the input dead zone. Moreover, by eliminating the input dead zone of the input signal Vin, it becomes needless to provide the offset voltage of 1.9 volts in consideration of the variations of the threshold voltage Vthp of the p-type transistor and the threshold voltage Vthn of the n-type transistor. Therefore, since the operational amplifier can be formed using the voltage between the higher potential side VDD of the power supply voltages and the lower potential side VSS of the power supply voltages as the amplitude, the range of the operational voltage can be narrowed without degrading the driving capacity, thus further reducing the power consumption. This means implementation of the step-up circuit or a lower withstand voltage of the manufacturing process, thus realizing the cost reduction.

A detailed configuration example of the operational amplifier according to the present embodiment is hereinafter described.

In FIG. 4, the p-type differential amplifier circuit 100 includes the first current source CS1, the first differential pair of transistors described above, and the first current mirror circuit CM1. One end of the first current source CS1 is supplied with the higher potential side VDD (the first power supply voltage) of the power supply voltages. The other end of the first current source CS1 is connected to the sources of the p-type transistors PT1, PT2 forming the first differential pair of transistors described above.

The first current mirror circuit CM1 includes the first pair of n-type (the second conduction type) transistors whose gates are connected to each other. The first pair of transistors includes n-type transistors NT1, NT2. The sources of the n-type transistors NT1, NT2 are supplied with the lower potential side VSS (the second power supply voltage) of the power supply voltages. The drain of the n-type transistor NT1 is connected to the output node ND1 (the first output node). The drain of the n-type transistor NT2 is connected to the inverted output node NXD1 (the first inverted output node). The drain and the gate of the n-type transistor NT2 (the transistor forming the first differential pair of transistors and being connected to the inverted output node NXD1) are connected to each other.

Further, the n-type differential amplifier circuit 110 includes the second current source CS2, the second differential pair of transistors described above, and the second current mirror circuit CM2. One end of the second current source CS2 is supplied with the lower potential side VSS (the second power supply voltage) of the power supply voltages. The other end of the second current source CS2 is connected to the sources of the n-type transistors NT3, NT4 forming the second differential pair of transistors described above.

The second current mirror circuit CM2 includes the second pair of p-type (the first conduction type) transistors whose gates are connected to each other. The second pair of transistors includes p-type transistors PT3, PT4. The sources of the p-type transistors PT3, PT4 are supplied with the higher potential side VDD (the first power supply voltage) of the power supply voltages. The drain of the p-type transistor PT3 is connected to the output node ND2 (the second output node). The drain of the p-type transistor PT4 is connected to the inverted output node NXD2 (the second inverted output node). The drain and the gate of the p-type transistor PT4 (the transistor forming the second differential pair of transistors and being connected to the inverted output node NXD2) are connected to each other.

Further, the first auxiliary circuit 130 can include the p-type (the first conduction type) of first and second current driver transistors PA1, PA2, and a first current control circuit 132. The sources of the first and the second current driver transistors PA1, PA2 are supplied with the higher potential side VDD (the first power supply voltage) of the power supply voltages. The drain of the first current driver transistor PA1 is connected to the output node ND1 (the first output node). The drain of the second current driver transistor PA2 is connected to the inverted output node NXD1 (the first inverted output node).

The first current control circuit 132 controls the gate voltages of the first and the second current driver transistors PA1, PA2 in accordance with the input signal Vin and the output signal Vout. More specifically, when (the absolute value of) the voltage between the gate and the source of the p-type transistor PT1 composing the first differential pair of transistors and having the gate to which the input signal Vin is input is smaller than (the absolute value of) the threshold voltage of the transistor, the first current control circuit 132 controls the gate voltages of the first and the second current driver transistors PA1, PA2 to drive at least one of the output node ND1 (the first output node) and the inverted output node NXD1 (the first inverted output node).

Further, the second auxiliary circuit 140 can include the n-type (the second conduction type) of a third and a forth current driver transistors NA3, NA4, and a second current control circuit 142. The sources of the third and the fourth current driver transistors NA3, NA4 are supplied with the lower potential side VSS (the second power supply voltage) of the power supply voltages. The drain of the third current driver transistor NA3 is connected to the output node ND2 (the second output node). The drain of the fourth current driver transistor NA4 is connected to the inverted output node NXD2 (the second inverted output node).

The second current control circuit 142 controls the gate voltages of the third and the fourth current driver transistors NA3, NA4 in accordance with the input signal Vin and the output signal Vout. More specifically, when the absolute value of the voltage between the gate and the source of the n-type transistor NT3 composing the second differential pair of transistors and having the gate to which the input signal Vin is input is smaller than the absolute value of the threshold voltage of the transistor, the second current control circuit 142 controls the gate voltages of the third and the fourth current driver transistors NA3, NA4 to drive at least one of the output node ND2 (the second output node) and the inverted output node NXD2 (the second inverted output node).

Figure 6:
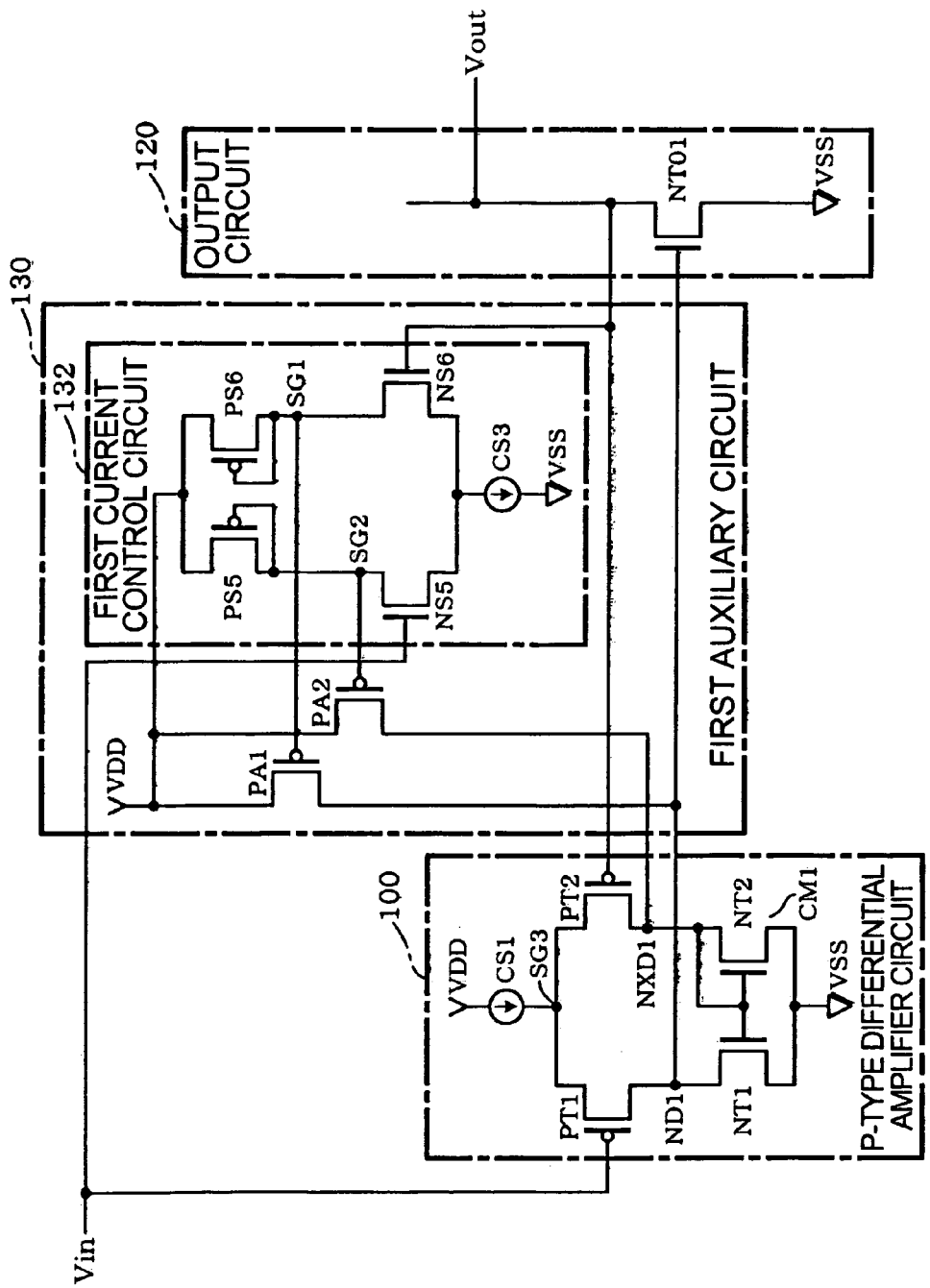
FIG. 6 is a circuit diagram of a configuration example of a first current control circuit.

FIG. 6 shows a configuration example of the first current control circuit 132 shown in FIG. 1. Note that the same parts as those of the operational amplifier shown in FIG. 4 are denoted with the same reference numerals and explanations therefore are omitted if appropriate.

The first current control circuit 132 includes the third current source CS3, a third differential pair of transistors of the n-type (the second conduction type), fifth and sixth current driver transistors PS5, PS6 of the p-type (the first conduction type).

One end of the third current source CS3 is supplied with the lower potential side VSS (the second power supply voltage) of the power supply voltages.

The third differential pair of transistors includes n-type transistors NS5, NS6. The sources of the n-type transistors NS5, NS6 are connected to the other end of the third current source CS3. The input signal Vin is input to the gate of the n-type transistor NS5. The output signal Vout is input to the gate of the n-type transistor NS6.

The sources of the fifth and the sixth current driver transistors PS5, PS6 are supplied with the higher potential side VDD (the first power supply voltage) of the power supply voltages. The drain of the fifth current driver transistor PS5 is connected to the drain of the n-type transistor NS5 forming the third differential pair of transistors. The drain of the sixth current driver transistor PS6 is connected to the drain of the n-type transistor NS6 forming the third differential pair of transistors. The gate and the drain of the fifth current driver transistor PS5 are connected to each other. The gate and the drain of the sixth current driver transistor PS6 are connected to each other.

The drain of the n-type transistor NS5 (the transistor forming the third pair of differential transistors and having a gate to which the input signal Vin is input) forming the third differential pair of transistors (or the drain of the fifth current driver transistor PS5) is connected to the gate of the second current driver transistor PA2. Further, the drain of the n-type transistor NS6 (the transistor forming the third pair of differential transistors and having a gate to which the output signal Vout is input) forming the third differential pair of transistors (or the drain of the sixth current driver transistor PS6) is connected to the gate of the first current driver transistor PA1.

Namely, the first and the sixth current driver transistors PA1, PS6 compose a current mirror circuit. Similarly, the second and the fifth current driver transistors PA2, PS5 compose a current mirror circuit.

Figure 7:
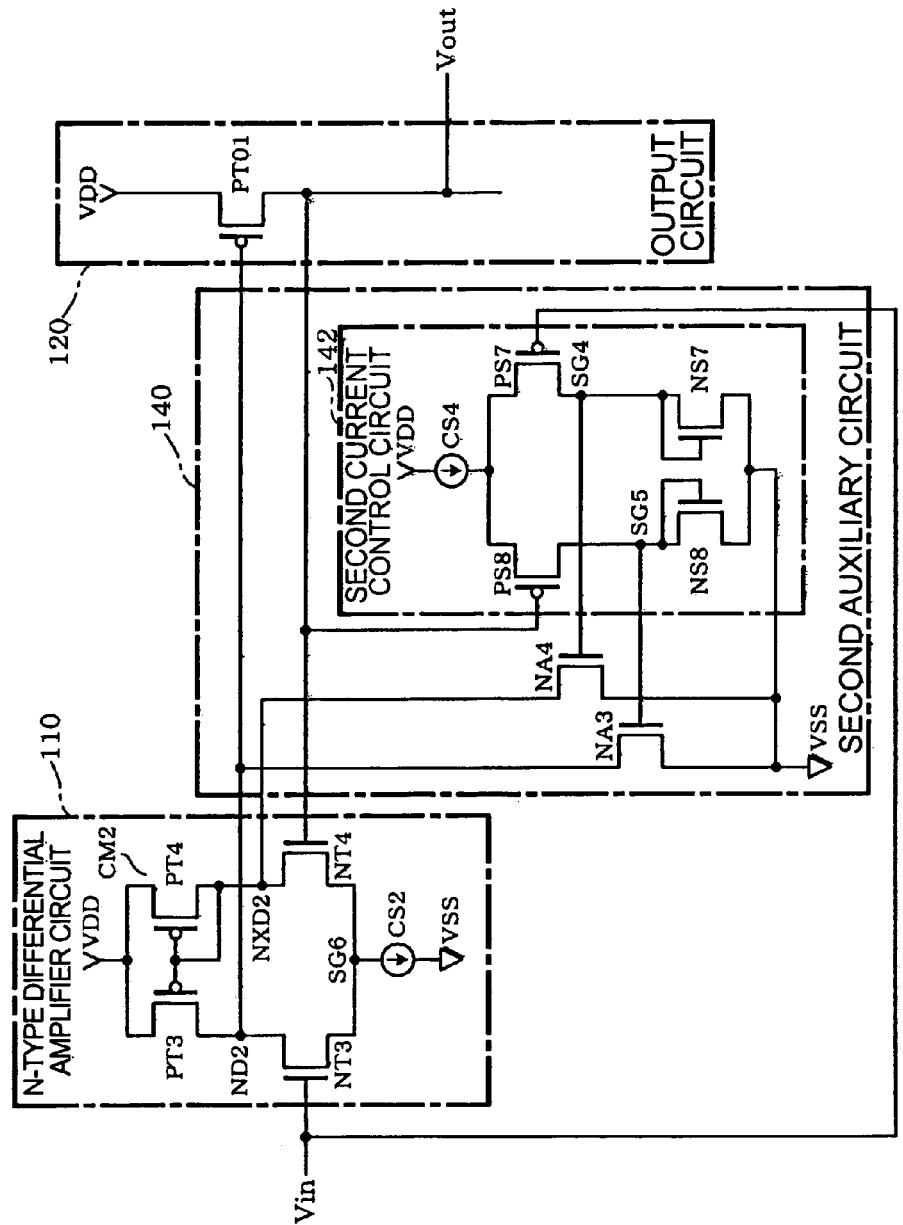
FIG. 7 is a circuit diagram of a configuration example of a second current control circuit.

FIG. 7 shows a configuration example of the second current control circuit 142 shown in FIG. 2. Note that the same parts as those of the operational amplifier shown in FIG. 4 are denoted with the same reference numerals and explanations therefore are omitted if appropriate.

The second current control circuit 142 includes the fourth current source CS4, a fourth differential pair of transistors of the p-type (the first conduction type), seventh and eighth current driver transistors NS7, NS8 of the n-type (the second conduction type).

One end of the fourth current source CS4 is supplied with the higher potential side VDD (the first power supply voltage) of the power supply voltages.

The fourth differential pair of transistors includes p-type transistors PS7, PS8. The sources of the p-type transistors PS7, PS8 are connected to the other end of the fourth current source CS4. The input signal Vin is input to the gate of the p-type transistor PS7. The output signal Vout is input to the gate of the p-type transistor PS8.

The sources of the seventh and the eighth current driver transistors NS7, NS8 are supplied with the lower potential side VSS (the second power supply voltage) of the power supply voltages. The drain of the seventh current driver transistor NS7 is connected to the drain of the p-type transistor PS7 forming the fourth differential pair of transistors. The drain of the eighth current driver transistor NS8 is connected to the drain of the p-type transistor PS8 forming the fourth differential pair of transistors. The gate and the drain of the seventh current driver transistor NS7 are connected to each other. The gate and the drain of the eighth current driver transistor NS8 are connected to each other.

The drain of the p-type transistor PS7 (the transistor forming the fourth pair of differential transistors and having a gate to which the input signal Vin is input) forming the fourth differential pair of transistors (or the drain of the seventh current driver transistor NS7) is connected to the gate of the fourth current driver transistor NA4. Further, the drain of the p-type transistor PS8 (the transistor forming the fourth pair of differential transistors and having a gate to which the output signal Vout is input) forming the fourth differential pair of transistors (or the drain of the eighth current driver transistor NS8) is connected to the gate of the third current driver transistor NA3.

Namely, the third and the eighth current driver transistors NA3, NS8 compose a current mirror circuit. Similarly, the fourth and the seventh current driver transistors NA4, NS7 compose a current mirror circuit.

The operational amplifier having a configuration shown in FIG. 4 is hereinafter described assuming that the first auxiliary circuit 130 comprises the first current control circuit 132 shown in FIG. 6 and that the second auxiliary circuit 140 comprises the second current control circuit 142 having a configuration shown in FIG. 7.

First, if the following inequality is true, although the p-type differential amplifier circuit 100 operates properly with the p-type transistor PT1 switched on, the voltages of the nodes of the n-type differential amplifier circuit 110 become indefinite because the n-type transistor NT3 does not operate.

$$Vthn + VSS \geq Vin > VSS$$

At this point, focusing on the second auxiliary circuit 140, since the p-type transistor PS7 is switched on to lower its impedance, the gate voltage of the fourth current driver transistor NA4 rises. As a result, the impedance of the fourth current driver transistor NA4 is lowered. Therefore, the fourth current driver transistor NA4 drives the inverted output node NXD2 to pull in the current, thus lowering the potential of the inverted output node NXD2. As a result, the impedance of the p-type transistor PT3 is lowered to raise the potential of the output node ND2. The impedance of the second driver transistor PTO1 in the output circuit 120 rises to lower the potential of the output signal Vout. Thus, the impedance of the p-type transistor PS8 is lowered to raise the gate voltage of the third current driver transistor NA3. Accordingly, the impedance of the third current driver transistor NA3 is lowered to lower the potential of the output node ND2.

In this way, the result of raising the potential of the output node ND2 by lowering the impedance of the p-type transistor PT3 is fed back, and the potential of the output node ND2 is lowered by lowering the impedance of the third current driver transistor NA3. As a result, an equilibrium state is created, in which the voltage of the input signal Vin and the voltage of the output signal Vout are substantially the same, the gate voltage of the second driver transistor PT01 is determined to the most appropriate level.

Incidentally, when the following inequality is true, they operate in the reverse way.

$$VDD \geq Vin > VDD - |Vthp|$$

Namely, although the n-type differential amplifier circuit 110 operates properly with the n-type transistor NT3 switched on, the voltages of the nodes of the p-type differential amplifier circuit 100 become indefinite because the p-type transistor PT1 does not operate.

At this point, focusing on the first auxiliary circuit 130, since the n-type transistor NS5 is switched on to lower its impedance, the gate voltage of the second current driver transistor PA2 is lowered. As a result, the impedance of the second current driver transistor PA2 is lowered. Therefore, the second current driver transistor PA2 drives the inverted output node NXD1 to supply the current, thus raising the potential of the inverted output node NXD1. As a result, the impedance of the n-type transistor NT2 is lowered to lower the potential of the output node ND1. The impedance of the first driver transistor NTO1 in the output circuit 120 rises to raise the potential of the output signal Vout. Thus, the impedance of the n-type transistor NS6 is lowered to lower the gate voltage of the first current driver transistor PA1.

Accordingly, the impedance of the first current driver transistor PA1 is lowered to raise the potential of the output node ND1.

In this way, the result of lowering the potential of the output node ND1 by lowering the impedance of the n-type transistor NT2 is fed back, and the potential of the output node ND1 is raised by lowering the impedance of the first current driver transistor PA1. As a result, an equilibrium state is created, in which the voltage of the input signal Vin and the voltage of the output signal Vout are substantially the same, the gate voltage of the first driver transistor NTO1 is determined to the most appropriate level.

Incidentally, when the following inequality is true, since the p-type differential amplifier circuit 100 and the n-type differential amplifier circuit 110 operate to determine the potentials of the output nodes ND1, ND2, the equilibrium state is created, in which the voltage of the input signal Vin and the voltage of the output signal Vout are substantially the same, without operating the first and the second auxiliary circuits 130, 140.

$$VDD-|Vthp| \geq Vin \geq Vthn+VSS$$

Figure 8:
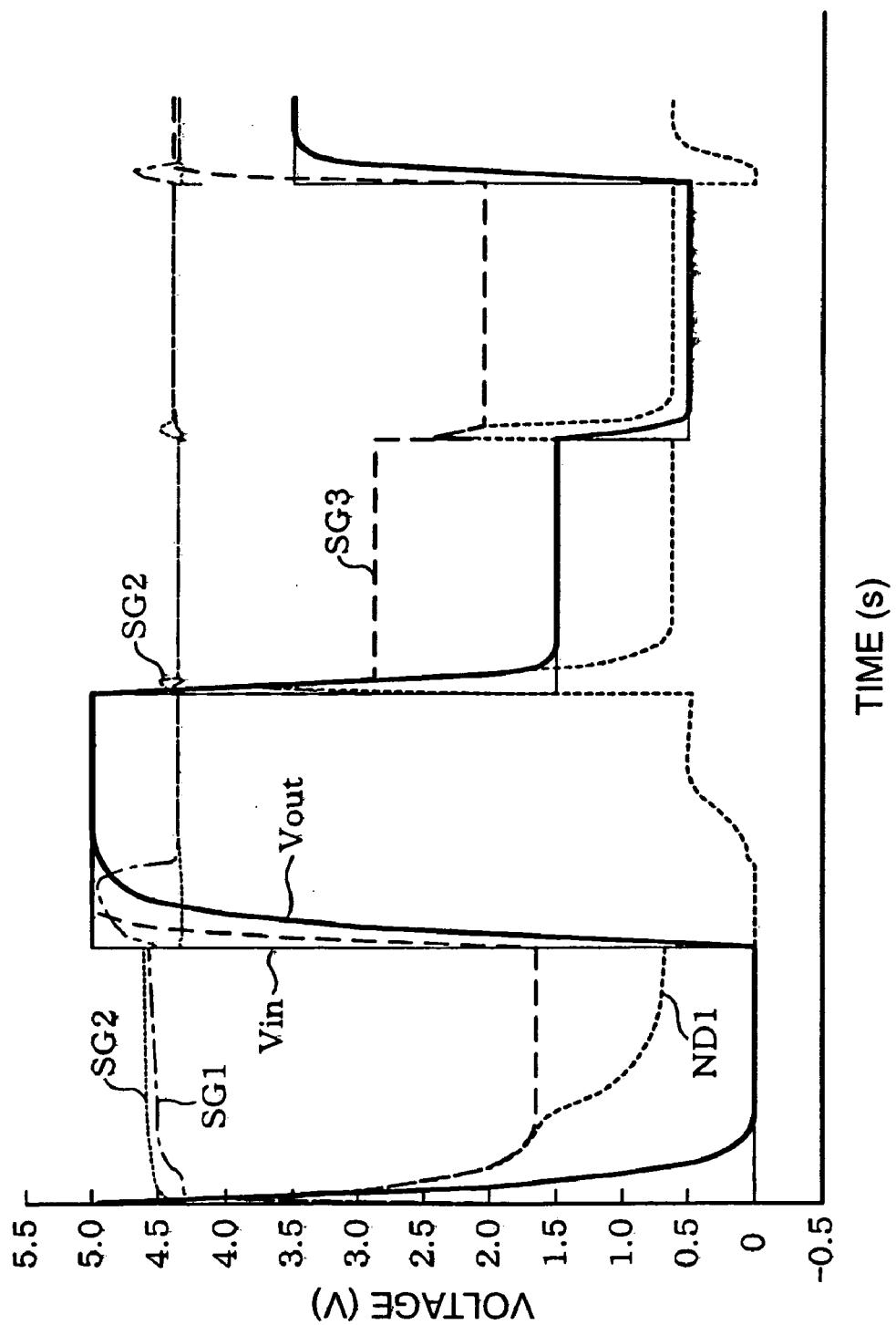
FIG. 8 is a chart showing a simulation result of the voltage variations at nodes of a p-type differential amplifier circuit and a first auxiliary circuit.
Figure 9:
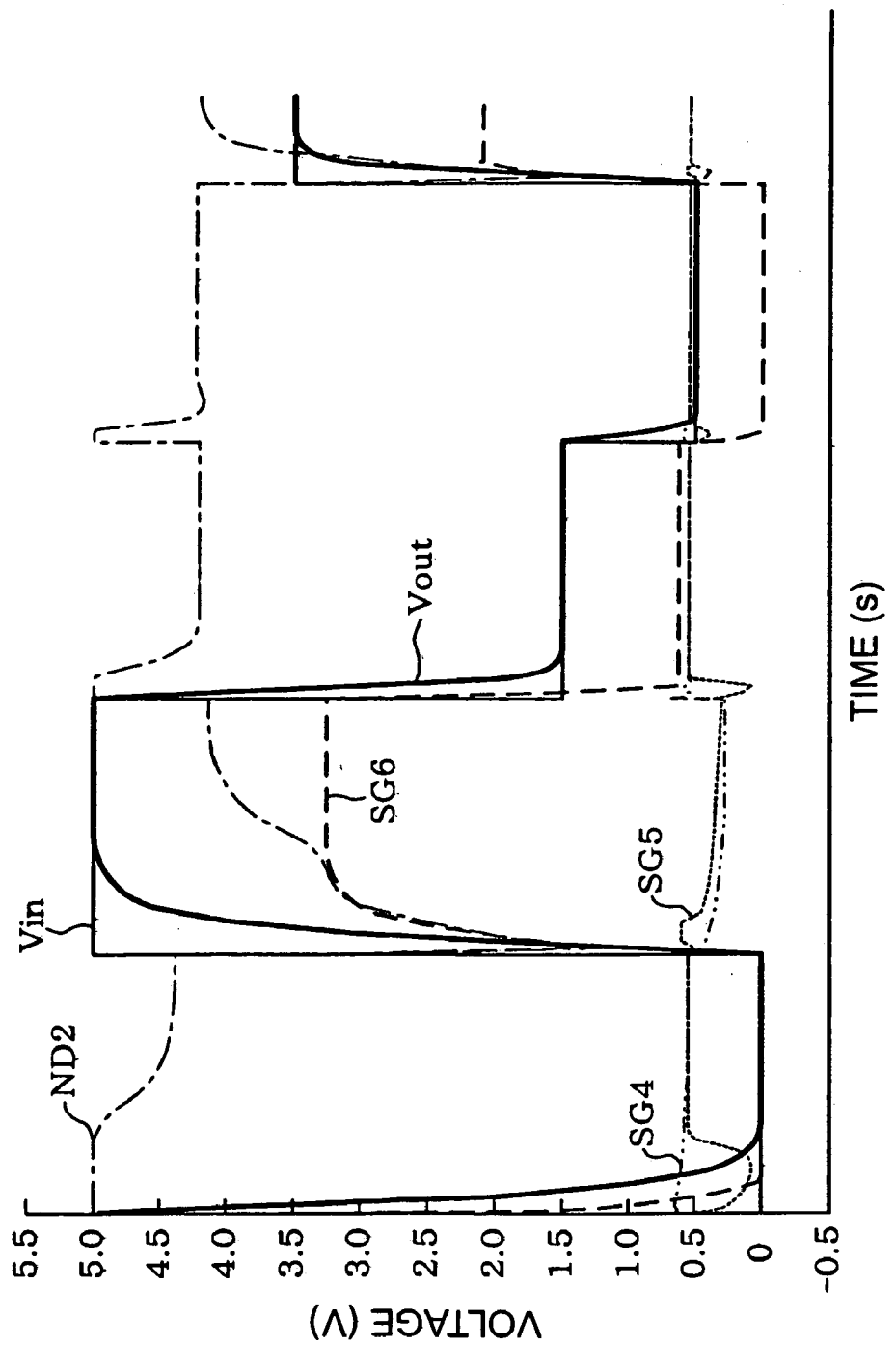
FIG. 9 is a chart showing a simulation result of the voltage variations at nodes of an n-type differential amplifier circuit and a second auxiliary circuit.

FIG. 8 shows a simulation result of the voltage variations at the nodes of the p-type differential amplifier circuit 100 and the first auxiliary circuit 130. FIG. 9 shows a simulation result of the voltage variations at the nodes of the n-type differential amplifier circuit 110 and the second auxiliary circuit 140. Further, FIG. 10 shows a simulation result of the voltage variations at the output nodes ND1, ND2.

In FIG. 8, a node SG1 represents the gate of the first current driver transistor PA1. A node SG2 represents the gate of the second current driver transistor PA2. A node SG3 represents the sources of the p-type transistors PT1, PT2 forming the first differential pair of transistors.

In FIG. 9, a node SG4 represents the gate of the fourth current driver transistor NA4. A node SG5 represents the gate of the third current driver transistor NA3. A node SG6 represents the sources of the n-type transistors NT3, NT4 forming the second differential pair of transistors.

Figure 10:
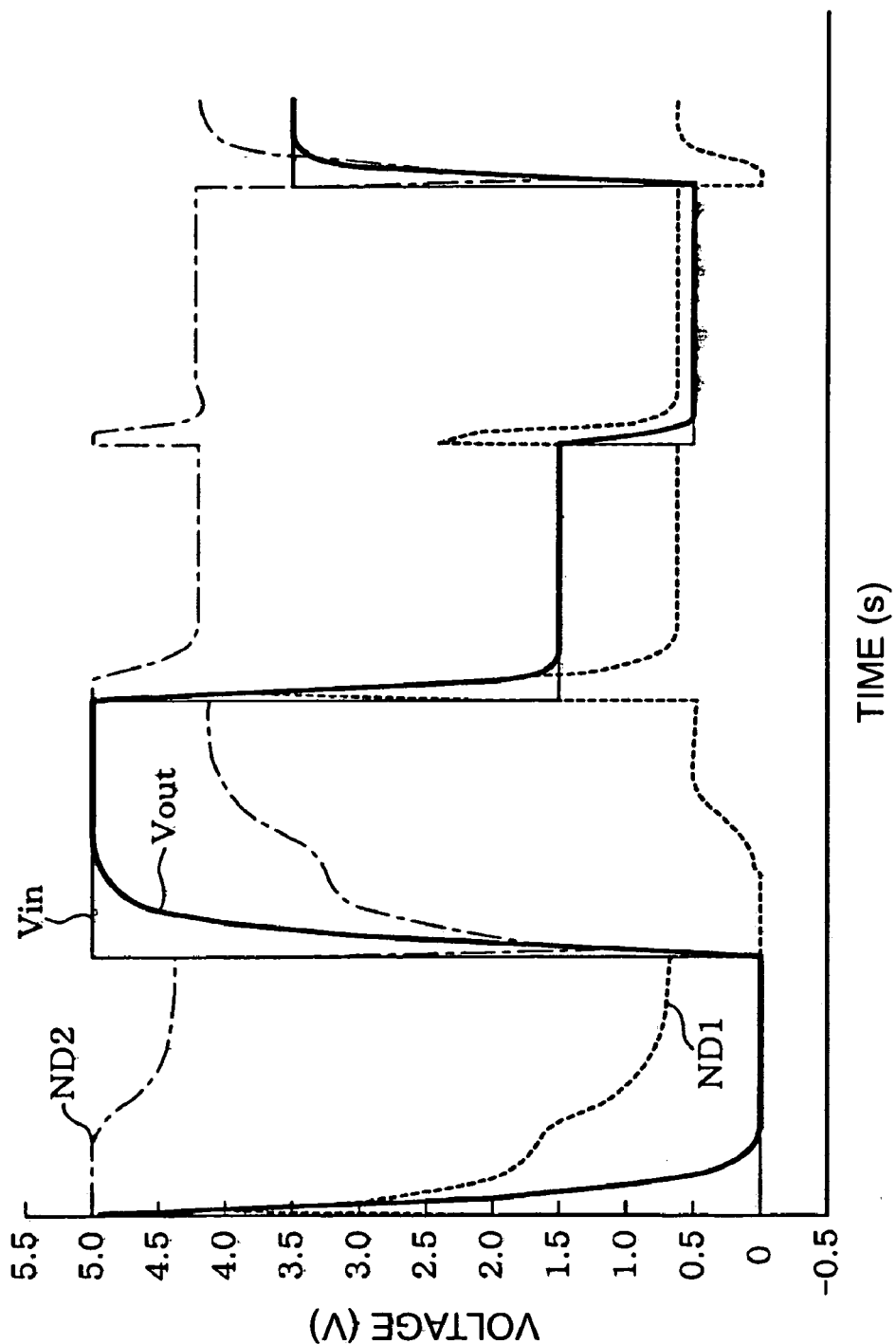
FIG. 10 is a chart showing a simulation result of the voltage variations at output nodes.

As also shown in FIGS. 8 through 10, even when the input signal of around 0.5 volts is input, the output node ND1 does not turn into the indefinite state, but controls the gate voltage of the first driver transistor NTO1 composing the output circuit 120.

As described above, according to the present embodiment, a so called rail-to-rail operation with no input dead zone can be realized, and the control of surely suppressing the through current in the output circuit 120 can also be realized. Thus, an operational amplifier capable of realizing significant low power consumption can be provided. Further, since class AB operation is possible, in polarity reversing driving for reversing voltage applied to liquid crystal, the data lines can stably be driven regardless of the polarity.

2.1 Adjustment of Current Value

In the operational amplifier of the present embodiment, the operating current values of the current sources of the p-type differential amplifier circuit 100, the n-type differential amplifier circuit 110, the first auxiliary circuit 130, and the second auxiliary circuit 140 can be arranged to prevent oscillation, thus further enhancing the stability of the circuits.

Figure 11:
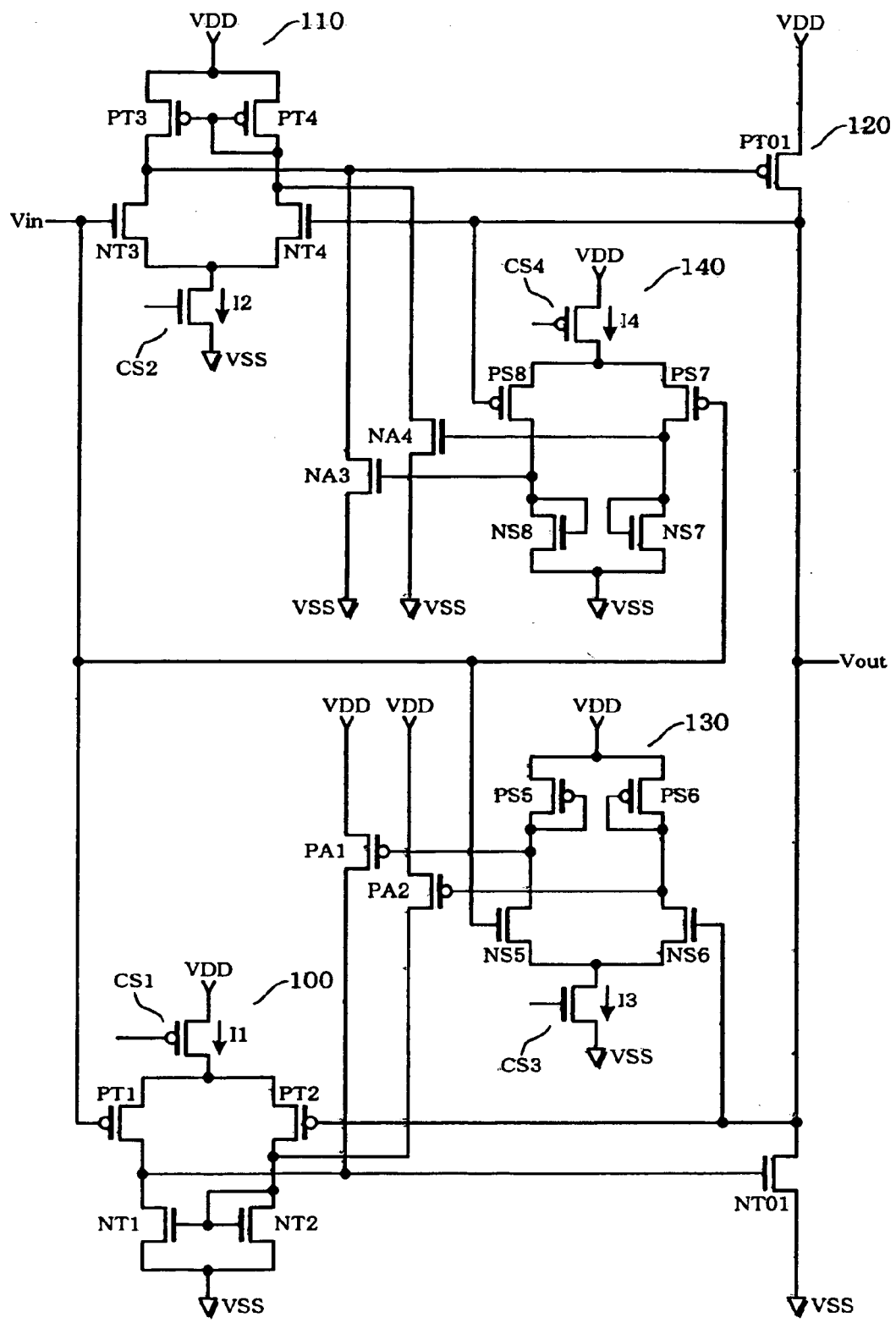
FIG. 11 is circuit diagram showing another configuration example of an operational amplifier according to the present embodiment.

Another configuration example of an operational amplifier according to the present embodiment is shown in FIG. 11. In FIG. 11, each of the current sources is composed of a transistor. In this case, wasteful current consumption in the current sources can be reduced by controlling the gate voltage of each of the transistors.

It is effective for preventing oscillation of the operational amplifier according to the present embodiment to equalize the drain currents of the first and the second driver transistors NTO1, PTO1 forming the output circuit 120. The drain current of the first driver transistor NTO1 is determined by the operating current value 11 of the first current source CS1 of the p-type differential amplifier circuit 100 and the operating current value 13 of the third current source CS3 of the first auxiliary circuit 130. The drain current of the second driver transistor PT01 is determined by the operating current value 12 of the second current source CS2 of the n-type differential amplifier circuit 110 and the operating current value 14 of the fourth current source CS4 of the second auxiliary circuit 140.

It is assumed here that the current value I1 is not equal to the current value I3. For example, it is assumed that the current value I1 is 10 while the current value I3 is 5. Similarly, it is assumed that the current value I2 is not equal to the current value I4. For example, it is assumed that the current value I2 is 10 while the current value I4 is 5.

When the input voltage Vin is in the operable range for both the p-type differential amplifier circuit 100 and the first auxiliary circuit 130, the drain current flowing through the first driver transistor NTO1 corresponds to, for example, 15 (=I1+I3=10+5). Similarly, when the input voltage Vin is in the operable range for both the n-type differential amplifier circuit 110 and the second auxiliary circuit 140, the drain current flowing through the second driver transistor PTO1 corresponds to, for example, 15 (=I2+I4=10+5).

On the contrary, when the voltage of the input signal Vin becomes too low for the n-type transistors to operate, the n-type differential amplifier circuit 110 and the first auxiliary circuit 130 no longer operate. Therefore, the current stops flowing from the second and the third current sources CS2, CS3 (I2=0, I3=0). Accordingly, the drain current flowing through the first driver transistor NTO1 corresponds to, for example, 10 (=I1), and the drain current flowing through the second driver transistor PTO1 corresponds to, for example, 5 (=I4). For example, the same is applied to the case in which the voltage of the input signal Vin rises too high for the p-type transistors to operate.

As described above, if the drain currents of the first and the second driver transistors composing the output circuit 120 are different, and accordingly, the rising shapes or the falling shapes of the output signal Vout are different from each other, the times necessary for stabilizing the output are different, thus easily causing oscillation.

Therefore, in the operational amplifier of the present embodiment, the operation current values of the first and the third current sources CS1, CS3 are preferably the same (I1=I3), and the operating current values of the second and the fourth current sources CS2, CS4 are preferably the same (I2=I4). This can be achieved by using the channel length L commonly in the transistors forming the first through the fourth current sources CS1 through CS4, making the channel widths of the transistors forming the first and the third current sources CS1, CS3 the same, and making the channel widths of the transistors forming the second and the fourth current sources CS2, CS4 the same.

Further, the operating current values of the first through fourth current sources CS1 through CS4 are preferably the same (I1=I2=I3=I4). Because the design can be easier in this case.

Further, by reducing at least one of the operating current values of the third and the fourth current sources CS3, CS4, further low power consumption can be achieved. In this case, the at least one of the operating current values of the third and the fourth current sources CS3, CS4 needs to be reduced without degrading the current drive capacity of each of the first through the fourth current driver transistors PAR, PA2, NA3, NA4.

Figure 12:
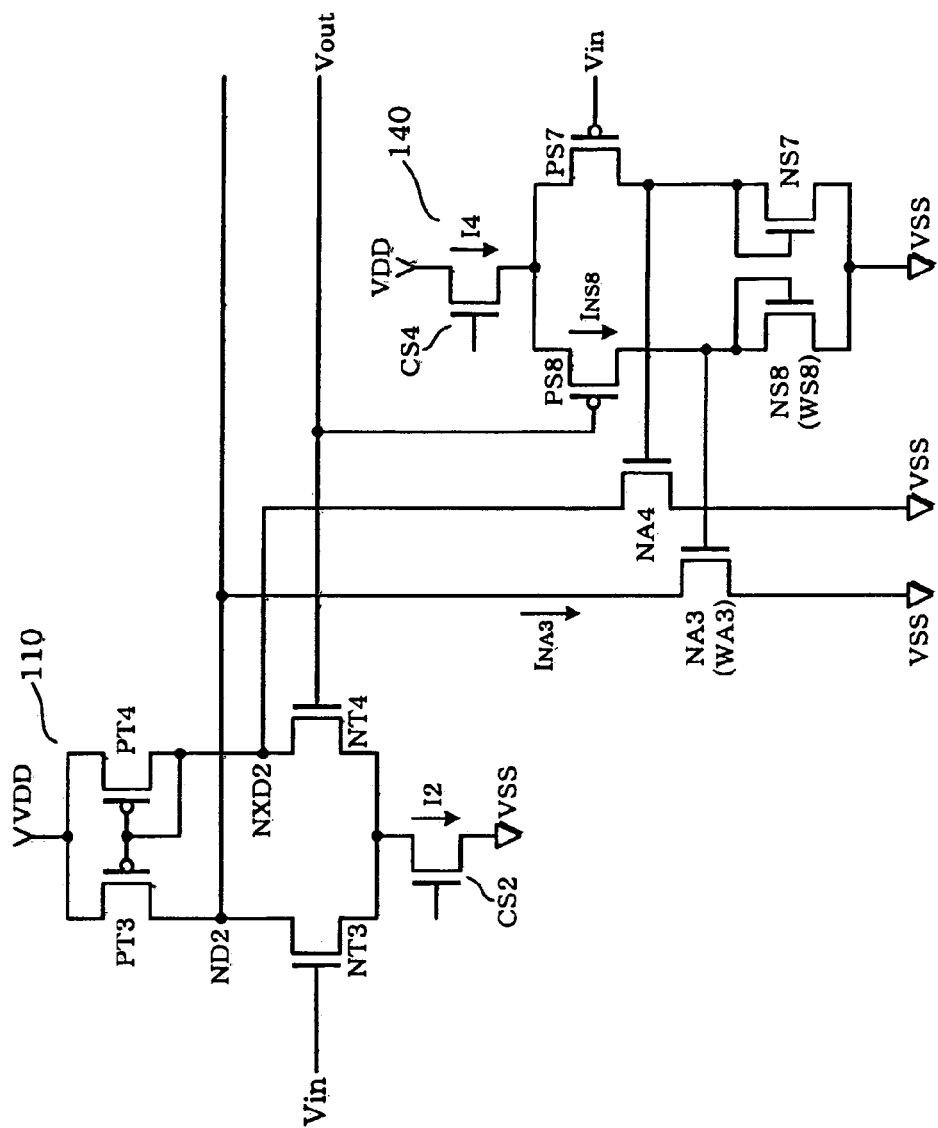
FIG. 12 is a circuit diagram for explaining an example of a configuration capable of reducing the operating current of a fourth current source.

FIG. 12 shows a diagram for explaining an example of a configuration capable of reducing the operating current value of the fourth current source CS4. Note that the same parts as those of the operational amplifier shown in FIGS. 4, 7, or 11 are denoted with the same reference numerals and explanations therefore are omitted if appropriate.

In FIG. 12, for reducing the operating current value of the fourth current source CS4, the third and the eighth current driver transistors NA3, NS8 composes a current mirror circuit. The channel length of the third current driver transistor NA3 is denoted with L, the channel width thereof is denoted with WA3, the drain current of the third current driver transistor NA3 is denoted with $I_{NA3}$, the channel length of the eighth current driver transistor NS8 is denoted with L, the channel width thereof is denoted with WS8, and the drain current of the third current driver transistor NS8 is denoted with $I_{NS8}$. In this case, the relationship can be expressed as the following.

$$I_{NA3} = (WA3/WS8) \times I_{NS8}$$

Here, (WA3/WS8) expresses the ratio of the current drive capacity of the third current driver transistor NA3 to the current drive capacity of the eighth current driver transistor NS8. Accordingly, by arranging (WA3/WS8) greater than 1, the drain current INS8 can be reduced without degrading the current drive capacity of the third current driver transistor NA3, and the operating current of the fourth current source CS4 can also be reduced.

Note that, in FIG. 12, the fourth and the seventh current driver transistors NA4, NS7 may compose a current mirror circuit.

Further, it is also preferable to reduce the operating current value of the third current source CS3. In this case, the first and the sixth current driver transistors PA1, PS6 may compose a current mirror circuit, or the second and the fifth current driver transistors PA2, PS5 may compose a current mirror circuit.

As described above, at least one of the ratio of the current drive capacity of the first current driver transistor PA1 to the current drive capacity of the sixth current driver transistor PS6, the ratio of the current drive capacity of the second current driver transistor PA2 to the current drive capacity of the fifth current driver transistor PS5, the ratio of the current drive capacity of the third current driver transistor NA3 to the current drive capacity of the eighth current driver transistor NS8, and the ratio of the current drive capacity of the fourth current driver transistor NA4 to the current drive capacity of the seventh current driver transistor NS7 is arranged to be greater than 1. With such an arrangement, at least one of the operating current values of the third and the fourth current sources CS3, CS4 can be reduced.

Note that the present invention is not limited to the embodiment described above, and can be put into practice with various modifications within the scope or the spirit of the present invention. For example, although an application to a liquid crystal display panel as a display panel is described, there is no limitation thereto. Further, although the transistors are described as MOS transistors, they are not limited thereto.

Further, configurations of the p-type differential amplifier circuit, the n-type differential amplifier circuit, the output circuit, the first auxiliary circuit, and the second auxiliary circuit are not limited to those described, and various equivalent configurations thereto can also be adopted.

What is claimed is:

1. An operational amplifier comprising:
   a differential amplifier circuit of a first conduction type including a first differential pair of transistors of the first conduction type, the source of each of the transistors being connected to a first current source, and an input signal and an output signal being respectively input to the gate of each of the transistors, and a first current mirror circuit for generating drain current for each of the first differential pair of transistors;
   a differential amplifier circuit of a second conduction type including a second differential pair of transistors of the second conduction type, the source of each of the transistors being connected to a second current source, and the input signal and the output signal being respectively input to the gate of each of the transistors, and a second current mirror circuit for generating drain current for each of the second differential pair of transistors;
   a first auxiliary circuit for driving at least one of a first output node and a first inverted output node in accordance with the input signal and the output signal, the first output node representing drains of the two transistors composing the first differential pair of transistors;
   a second auxiliary circuit for driving at least one of a second output node and a second inverted output node in accordance with the input signal and the output signal, the second output node representing drains of the two transistors composing the second differential pair of transistors; and
   an output circuit including a first driver transistor of the second conduction type whose gate voltage is controlled in accordance with the voltage of the first output node, and a second driver transistor of the first conduction type whose drain is connected to the drain of the first driver transistor, and whose gate voltage is controlled in accordance with the voltage of the second output node, and outputting the voltage of the drain of the first driver transistor as the output signal,
   wherein the first auxiliary circuit controls the gate voltage of the first driver transistor by driving at least one of the first output node and the first inverted output node when an absolute value of a voltage between the gate and the source of the transistor composing the first differential pair of transistors and having a gate to which the input signal is input is smaller than an absolute value of a threshold voltage of the transistor,
   and wherein the second auxiliary circuit controls the gate voltage of the second driver transistor by driving at least one of the second output node and the second inverted output node when an absolute value of a voltage between the gate and the source of the transistor composing the second differential pair of transistors and having a gate to which the input signal is input is smaller than an absolute value of a threshold voltage of the transistor.

2. An operational amplifier comprising:
   a differential amplifier circuit of a first conduction type for amplifying a difference between an input signal and an output signal;
   a differential amplifier circuit of a second conduction type for amplifying the difference between the input signal and the output signal;

a first auxiliary circuit for driving at least one of a first output node and a first inverted output node of the differential amplifier circuit of the first conduction type in accordance with the input signal and the output signal;

a second auxiliary circuit for driving at least one of a second output node and a second inverted output node of the differential amplifier circuit of the second conduction type in accordance with the input signal and the output signal; and an output circuit for generating the output signal in accordance with the voltage of the first and the second output nodes, wherein the differential amplifier circuit of the first conduction type includes:

a first current source whose one end is supplied with a first power supply voltage;

a first differential pair of transistors of the first conduction type, the source of each of the transistors being connected to the other end of the first current source, the drain of each of the transistors being respectively connected to the first output node and the first inverted output node, and the input signal and the output signal being respectively input to the gate of each of the transistors; and a first current mirror circuit including a first pair of transistors of the second conduction type whose gates are connected to each other, the source of each of the transistors composing the first pair of transistors being supplied with a second power supply voltage, the drain of each of the transistors being respectively connected to the first output node and the first inverted output node, and the drain and the gate of the transistor being connected to each other, the transistor composing the first pair of transistors and being connected to the first inverted output node, the differential amplifier circuit of the second conduction type includes:

a second current source whose one end is supplied with the second power supply voltage;

a second differential pair of transistors of the second conduction type, the source of each of the transistors being connected to the other end of the second current source, the drain of each of the transistors being respectively connected to the second output node and the second inverted output node, and the input signal and the output signal being respectively input to the gate of each of the transistors; and a second current mirror circuit including a second pair of transistors of the first conduction type whose gates are connected to each other, the source of each of the transistors composing the second pair of transistors being supplied with the first power supply voltage, the drain of each of the transistors being respectively connected to the second output node and the second inverted output node, and the drain and the gate of the transistor composing the first pair of transistors and connected to the second inverted output node being connected to each other, the output circuit includes:

a second driver transistor of the first conduction type whose gate is connected to the second output node, and a first driver transistor of the second conduction type whose gate is connected to the first output node and whose drain is connected to the drain of the second driver transistor, and outputs the voltage of the drain as the output signal, wherein the first auxiliary circuit controls the gate voltage of the first driver transistor by driving at least one of the first output node and the first inverted output node when an absolute value of a voltage between the gate and the source of the transistor composing the first differential pair of transistors and having a gate to which the input signal is input is smaller than an absolute value of a threshold voltage of the transistor, and wherein the second auxiliary circuit controls the gate voltage of the second driver transistor by driving at least one of the second output node and the second inverted output node when an absolute value of a voltage between the gate and the source of the transistor composing the second differential pair of transistors and having a gate to which the input signal is input is smaller than an absolute value of a threshold voltage of the transistor.

3. The operational amplifier according to claim 1, wherein the first auxiliary circuit includes:

first and second current driver transistors of the first conduction type, the source of each of the transistors being supplied with the first power supply voltage, the drain of each of the transistors being respectively connected to the first output node and the first inverted output node; and a first current control circuit for controlling the gate voltages of the first and the second current driver transistors in accordance with the input signal and the output signal, wherein the first current control circuit controls the gate voltages of the first and the second current driver transistor so as to drive at least one of the first output node and the first inverted output node when an absolute value of a voltage between the gate and the source of the transistor composing the first differential pair of transistors and having a gate to which the input signal is input is smaller than an absolute value of a threshold voltage of the transistor.

4. The operational amplifier according to claim 1, wherein the second auxiliary circuit includes:

third and fourth current driver transistors of the second conduction type, the source of each of the transistors being supplied with the second power supply voltage, the drain of each of the transistors being respectively connected to the second output node and the second inverted output node, a second current control circuit for controlling the gate voltages of the third and the fourth current driver transistors in accordance with the input signal and the output signal, and wherein the second current control circuit controls the gate voltages of the third and the fourth current driver transistors so as to drive at least one of the second output node and the second inverted output node when an absolute value of a voltage between the gate and the source of the transistor composing the second differential pair of transistors and having a gate to which the input signal is input is smaller than an absolute value of a threshold voltage of the transistor.

5. The operational amplifier according to claim 3, wherein the first current control circuit includes:

a third current source whose one end is supplied with the second power supply voltage;

a third differential pair of transistors of the second conduction type, the source of each of the transistors being connected to the other end of the third current source, the input signal and the output signal being respectively input to the gate of each of the transistors; and fifth and sixth current driver transistors of the first conduction type, the source of each of the transistors being supplied with the first power supply voltage, the drain of each of the transistors being respectively connected to the drain of each of the transistors of the third differential pair of transistors, the gate and the drain of each of the transistors being connected to each other, the drain of the transistor composing the third differential pair of transistors and having a gate to which the input signal is input being connected to the gate of the second current driver transistor, the drain of the transistor composing the third differential pair of transistors and having a gate to which the output signal is input being connected to the gate of the first current driver transistor.

6. The operational amplifier according to claim 3, wherein the second current control circuit includes:

a fourth current source whose one end is supplied with the first power supply voltage;

a fourth differential pair of transistors of the first conduction type, the source of each of the transistors being connected to the other end of the fourth current source, the input signal and the output signal being respectively input to the gate of each of the transistors; and seventh and eighth current driver transistors of the second conduction type, the source of each of the transistors being supplied with the second power supply voltage, the drain of each of the transistors being respectively connected to the drain of each of the transistors of the fourth differential pair of transistors, the gate and the drain of each of the transistors being connected to each other, the drain of the transistor composing the fourth differential pair of transistors and having a gate to which the input signal is input being connected to the gate of the fourth current driver transistor, the drain of the transistor composing the fourth differential pair of transistors and having a gate to which the output signal is input being connected to the gate of the third current driver transistor.

7. The operational amplifier according to claim 5, wherein the second current control circuit includes:

a fourth current source whose one end is supplied with the first power supply voltage;

a fourth differential pair of transistors of the first conduction type, the source of each of the transistors being connected to the other end of the fourth current source, the input signal and the output signal being respectively input to the gate of each of the transistors; and seventh and eighth current driver transistors of the second conduction type, the source of each of the transistors being supplied with the second power supply voltage, the drain of each of the transistors being respectively connected to the drain of each of the transistors of the fourth differential pair of transistors, the gate and the drain of each of the transistors being connected to each other, the drain of the transistor composing the fourth differential pair of transistors and having a gate to which the input signal is input being connected to the gate of the fourth current driver transistor, the drain of the transistor composing the fourth differential pair of transistors and having a gate to which the output signal is input being connected to the gate of the third current driver transistor.

8. The operational amplifier according to claim 7, wherein operating current values of the first and the third current sources are the same, and operating current values of the second and the fourth current sources are the same.

9. The operational amplifier according to claim 8, wherein the operating current values of the first through the fourth current sources are the same.

10. The operational amplifier according to claim 7, wherein at least one of the ratio of a current drive capacity of the first current driver transistor to the current drive capacity of the sixth current driver transistor, the ratio of the current drive capacity of the second current driver transistor to the current drive capacity of the fifth current driver transistor, the ratio of the current drive capacity of the third current driver transistor to the current drive capacity of the eighth current driver transistor, and the ratio of the current drive capacity of the fourth current driver transistor to the current drive capacity of the seventh current driver transistor is greater than 1.

11. A driver circuit for driving an electro-optic device having a plurality of scanning lines, a plurality of data lines, a pixel electrode specified by the scanning lines and the data lines, comprising:

the operational amplifier according to claim 1 provided for the data lines; and a data voltage generation circuit provided for the data lines for generating a data voltage as an input signal to the operational amplifier.

12. The operational amplifier according to claim 4, wherein the first current control circuit includes:

a third current source whose one end is supplied with the second power supply voltage;

a third differential pair of transistors of the second conduction type, the source of each of the transistors being connected to the other end of the third current source, the input signal and the output signal being respectively input to the gate of each of the transistors; and fifth and sixth current driver transistors of the first conduction type, the source of each of the transistors being supplied with the first power supply voltage, the drain of each of the transistors being respectively connected to the drain of each of the transistors of the third differential pair of transistors, the gate and the drain of each of the transistors being connected to each other, the drain of the transistor composing the third differential pair of transistors and having a gate to which the input signal is input being connected to the gate of the second current driver transistor, the drain of the transistor composing the third differential pair of transistors and having a gate to which the output signal is input being connected to the gate of the first current driver transistor.

13. The operational amplifier according to claim 4, wherein the second current control circuit includes:

a fourth current source whose one end is supplied with the first power supply voltage;

a fourth differential pair of transistors of the first conduction type, the source of each of the transistors being connected to the other end of the fourth current source, the input signal and the output signal being respectively input to the gate of each of the transistors; and seventh and eighth current driver transistors of the second conduction type, the source of each of the transistors being supplied with the second power supply voltage, the drain of each of the transistors being respectively connected to the drain of each of the transistors of the fourth differential pair of transistors, the gate and the drain of each of the transistors being connected to each other, the drain of the transistor composing the fourth differential pair of transistors and having a gate to which the input signal is input being connected to the gate of the fourth current driver transistor, the drain of the transistor composing the fourth differential pair of transistors and having a gate to which the output signal is input being connected to the gate of the third current driver transistor.

14. The operational amplifier according to claim 12, wherein the second current control circuit includes:

a fourth current source whose one end is supplied with the first power supply voltage;

a fourth differential pair of transistors of the first conduction type, the source of each of the transistors being connected to the other end of the fourth current source, the input signal and the output signal being respectively input to the gate of each of the transistors; and seventh and eighth current driver transistors of the second conduction type, the source of each of the transistors being supplied with the second power supply voltage, the drain of each of the transistors being respectively connected to the drain of each of the transistors of the fourth differential pair of transistors, the gate and the drain of each of the transistors being connected to each other, the drain of the transistor composing the fourth differential pair of transistors and having a gate to which the input signal is input being connected to the gate of the fourth current driver transistor, the drain of the transistor composing the fourth differential pair of transistors and having a gate to which the output signal is input being connected to the gate of the third current driver transistor.

15. The operational amplifier according to claim 14, wherein operating current values of the first and the third current sources are the same, and operating current values of the second and the fourth current sources are the same.

16. The operational amplifier according to claim 15, wherein the operating current values of the first through the fourth current sources are the same.

17. The operational amplifier according to claim 14, wherein at least one of the ratio of a current drive capacity of the first current driver transistor to the current drive capacity of the sixth current driver transistor, the ratio of the current drive capacity of the second current driver transistor to the current drive capacity of the fifth current driver transistor, the ratio of the current drive capacity of the third current driver transistor to the current drive capacity of the eighth current driver transistor, and the ratio of the current drive capacity of the fourth current driver transistor to the current drive capacity of the seventh current driver transistor is greater than 1.

* * * * *